United States Patent [19]

Yamashita et al.

[11] Patent Number: 5,610,430
[45] Date of Patent: Mar. 11, 1997

[54] SEMICONDUCTOR DEVICE HAVING REDUCED GATE OVERLAPPING CAPACITANCE

[75] Inventors: Kyoji Yamashita, Osaka; Shinji Odanaka, Hirakata; Kazumi Kurimoto, Kobe; Hiroyuki Umimoto, Takarazuka, all of Japan

[73] Assignee: Matsushita Electric Industrial Co., Ltd., Kadoma, Japan

[21] Appl. No.: 494,384

[22] Filed: Jun. 26, 1995

[30] Foreign Application Priority Data

Jun. 27, 1994 [JP] Japan ..................... 6-144839

[51] Int. Cl.$^6$ ................. H01L 29/76; H01L 29/94; H01L 27/088
[52] U.S. Cl. ............... 257/412; 257/333; 257/386; 257/900
[58] Field of Search ..................... 257/333, 386, 257/410, 411, 412, 413, 408, 900

[56] References Cited

U.S. PATENT DOCUMENTS

| 4,638,347 | 1/1987 | Iyer ................................. 257/900 |
| 5,241,211 | 8/1993 | Tashiro ............................. 257/347 |
| 5,471,080 | 11/1995 | Satoh et al. ..................... 257/412 |

FOREIGN PATENT DOCUMENTS

| 1-289166 | 11/1989 | Japan ............................ 257/412 |
| 4127538 | 4/1992 | Japan . |
| 4-116869 | 4/1992 | Japan ............................ 257/333 |

OTHER PUBLICATIONS

Kurimoto et al, IEDM 91, pp. 541–544, 1991, "A T–Gate Overlapped LDD Device With High Circuit Performance and High Reliability."

Tseng et al, 1990 Symposium on VLSI Technology, pp. 111–112, 1990, "The Effect of Silicon Gate Microstructure and Gate Oxide Process . . . ".

*Primary Examiner*—Wael Fahmy
*Attorney, Agent, or Firm*—Renner, Otto, Boisselle & Sklar

[57] ABSTRACT

The semiconductor device of the invention includes: a semiconductor substrate of a first conductivity type; a gate insulating film formed on a selected region on a main surface of the semiconductor substrate; a gate electrode formed on the gate insulating film; and a source region and a drain region which are formed of high-concentration impurity diffusion layers of a second conductivity type in the semiconductor substrate. In the semiconductor device, a thickness of both end portions of the gate insulating film is larger than a thickness of a center portion of the gate insulating film, and each of the source region and the drain region includes a first portion located under both end-portions of the gate insulating film and a second portion having a thickness equal to or larger than a thickness of the first portion. An impurity concentration in the first portion is substantially equal to an impurity concentration in the second portion.

7 Claims, 21 Drawing Sheets

SEMICONDUCTOR DEVICE HAVING REDUCED GATE OVERLAPPING CAPACITANCE

BACKGROUND OF THE INVENTION

1. Field of the Invention

The present invention relates to a semiconductor device and a method for fabricating the same.

2. Description of the Related Art

Various efforts have been made in order to reduce a power supply voltage so that a very large scale integrated circuit (VLSI) operates at a low power consumption. However, if the power supply voltage is reduced, then the delay time, caused by the decrease in the driving power, becomes disadvantageously longer.

In order to operate a complementary metal-oxide-semiconductor (CMOS) device having a conventional structure at a low power supply voltage, the following measures can be taken.

(1) Reducing a thickness of a gate insulting film.
(2) Reducing an effective channel length (or employing a single drain structure).
(3) Suppressing parasitic effects (gate resistance, junction/mirror capacitance, or the like).
(4) Reducing a threshold voltage.

If a device is operated at a low power supply voltage, then an electric field generated by a gate becomes small, so that a leak current is unlikely to flow. Therefore, as compared with a case where the device is operated at a normal voltage, a thinner gate oxide film can be used ((1)). On the other hand, since a drain voltage is also reduced, the degradation caused by hot carriers and a short-channel effect are improved. Therefore, in place of an LDD structure conventionally used for a sub-half micron device, a single drain structure can be used ((2)). As a result, a driving power is considerably reduced.

However, if the above effects (1) and (2) are enhanced, then a gate-drain overlapping capacitance, i.e., a mirror capacitance, increases, and the capacitance gives enormous influence upon the operation of the circuit (as a result, the delay time and the power consumption are much affected). That is why, it is desirable to develop a device structure where the above effects (1) and (2) are realized and a gate-drain overlapping capacitance is small ((3)), in order to realize a satisfactory low-voltage operation.

A T-shaped gate structure allowing for reducing a parasitic capacitance in a gate-drain overlapping lightly-doped drain (LDD) is suggested by K. Kurimoto et al. (IEEE 1991IEDM Technical Digest pp. 541–544).

However, the semiconductor device having the T-shaped gate structure disclosed by Kurimoto et al. is not suitable for realizing a semiconductor device having a fine structure in which a region of sub-half micron or less is formed. In a conventional metal-oxide-semiconductor field-effect transistor (MOSFET) mentioned above, side wall oxide films formed on both sides of the gate electrode function as a mask for implanting ions in forming a source and a drain. Accordingly, the source and the drain are shifted to outer positions. As a result, since the effective channel length increases, the driving power of an Nch MOSFET is reduced.

According to the semiconductor device fabrication method disclosed in the above-identified document, after a lightly-doped drain (LDD) is formed by an ion implantation method, a heat treatment is performed at 850° C. for 60 minutes in a wet oxygen environment, thereby oxidizing the surface of a P (phosphorus)-doped poly-silicon gate electrode so as to form a gate bird's beak. This method has the following two problems.

(1) By performing the heat treatment at 850° C. for several tens of minutes after the implantation to form the LDD, the resulting LDD layer diffuses vertically and horizontally, and the degradation is likely to be caused by a short channel effect.

(2) It is difficult to apply this method to a dual-gate technology.

SUMMARY OF THE INVENTION

The semiconductor device of the invention includes: a semiconductor substrate of a first conductivity type; a gate insulating film formed on a selected region on a main surface of the semiconductor substrate; a gate electrode formed on the gate insulating film; and a source region and a drain region which are formed of high-concentration impurity diffusion layers of a second conductivity type in the semiconductor substrate. In the semiconductor device, a thickness of both end portions of the gate insulating film is larger than a thickness of a center portion of the gate insulating film; and each of the source region and the drain region includes a first portion located under both end portions of the gate insulating film and a second portion having a thickness equal to or larger than a thickness of the first portion. An impurity concentration in the first portion is substantially equal to an impurity concentration in the second portion.

In one embodiment, the impurity concentration in the first portion is in an approximate range of $1\times10^{19}$ cm$^{-3}$ to $1\times10^{20}$ cm$^{-3}$.

In another embodiment, the semiconductor device further includes L-shaped side walls formed on both sides of the gate electrode. A part of the first portion of the source region and the drain region is disposed under the L-shaped side walls.

In still another embodiment, a film thickness of a bottom portion of the L-shaped side walls is larger than a film thickness of a side portion of the L-shaped side walls.

In still another embodiment, the gate electrode has a multi-layered structure including an amorphous silicon film and a polycrystalline silicon film.

In still another embodiment, the semiconductor substrate is an SOI substrate.

According to another aspect of the invention, a method for fabricating a semiconductor device is provided. The method includes the steps of: forming a gate insulating film on a semiconductor substrate of a first conductivity type; forming a gate electrode, an upper portion of each side of which is selectively covered with an insulating film which is unlikely to diffuse oxidizing agents, on the gate insulating film; oxidizing an exposed portion of each side of the gate electrode so as to grow a thermal oxide film thereon and make a thickness of both end portions of the gate insulating film larger than a thickness of a center portion of the gate insulating film; and forming a source region and a drain region in the semiconductor substrate, each of the source region and the drain region including a first portion located under both end portions of the gate insulating film and a second portion having a thickness equal to or larger than a thickness of the first portion, where an impurity concentration in the first portion is substantially equal to an impurity concentration in the second portion.

In one embodiment, the step of forming the gate electrode includes the steps of: depositing a conductive film on the gate insulating film; forming on the conductive film a photoresist for defining a position and a shape of the gate electrode; selectively removing an exposed portion of the conductive film by using the photoresist as a mask by a highly anisotropic etching process; removing the photoresist; depositing an insulating film which is unlikely to diffuse oxidizing agents; and etching back the insulating film and the conductive film by a highly anisotropic etching process, thereby leaving a part of the insulating film on both sides of the gate electrode.

In another embodiment, the step of depositing the conductive film includes the steps of: depositing a polycrystalline silicon film on the gate insulating film; and depositing an amorphous silicon film on the polycrystal-line silicon film.

In still another embodiment, the step of selectively removing the exposed portion of the conductive film includes the step of removing a part of the amorphous silicon film and a part of the polycrystalline silicon film.

In still another embodiment, the step of depositing the conductive film includes the steps of: depositing a first conductive layer on the gate insulating film; forming an oxide film on the first conductive layer; and depositing a second conductive layer on the oxide film.

In still another embodiment, the second conductive layer is made of amorphous silicon.

In still another embodiment, the step of depositing the conductive film includes the steps of: depositing a first conductive layer on the gate insulating film; forming a second conductive layer doped with an impurity on the first conductive layer; and depositing a third conductive layer on the second conductive layer.

According to still another aspect of the invention, a method for fabricating a semiconductor device is provided. The method includes the steps of: forming a gate insulating film on a semiconductor substrate of a first conductivity type; forming a gate electrode on the gate insulating film; oxidizing the gate insulating film so as to make a thickness of both end portions of the gate insulating film larger than a thickness of a center portion of the gate insulating film, the oxidizing step including a first oxidization step performed in an oxygen environment containing substantially no steam and no hydrogen, and a second oxidization step performed in an oxygen environment containing steam and hydrogen; and forming a source region and a drain region in the semiconductor substrate, each of the source region and the drain region including a first portion located under both end portions of the gate insulating film and a second portion having a thickness equal to or larger than a thickness of the first portion, where an impurity concentration in the first portion is substantially equal to an impurity concentration in the second portion.

According to still another aspect of the invention, a method for fabricating a semiconductor device is provided. The method includes the steps of: forming a gate insulating film on a semiconductor substrate of a first conductivity type; forming a gate electrode on the gate insulating film; removing an exposed portion on the semiconductor substrate and oxide films existing on both sides of the gate electrode by an isotropic etching process; forming a silicon nitride film on a surface exposed by the removing of the oxide films; oxidizing the gate insulating film so as to make a thickness of both end portions of the gate insulating film larger than a thickness of a center portion of the gate insulating film; and forming a source region and a drain region in the semiconductor substrate, each of the source region and the drain region including a first portion located under both end portions of the gate insulating film and a second portion having a thickness equal to or larger than a thickness of the first portion, where an impurity concentration in the first portion is substantially equal to an impurity concentration in the second portion.

In one embodiment, the step of forming the silicon nitride film includes implanting nitrogen ions in an oblique direction with respect to a normal of a main surface of the semiconductor substrate, and annealing in a nitrogen environment.

According to still another aspect of the invention, a method for fabricating a semiconductor device is provided. The method includes the steps of: forming a gate insulating film having a three-layered structure consisting of a silicon oxide film, a silicon nitride film and a silicon oxide film on a semiconductor substrate of a first conductivity type; forming a gate electrode on the gate insulating film without removing at least the silicon nitride film of the gate insulating film formed on the semiconductor substrate; oxidizing the gate insulating film so as to make a thickness of both end portions of the gate insulating film larger than a thickness of a center portion of the gate insulating film; and forming a source region and a drain region in the semiconductor substrate, each of the source region and the drain region including a first portion located under both end portions of the gate insulating film and a second portion having a thickness equal to or larger than a thickness of the first portion, where an impurity concentration in the first portion is substantially equal to an impurity concentration in the second portion.

According to still another aspect of the invention, a method for fabricating a semiconductor device is provided. The method includes the steps of: forming a gate insulating film having a three-layered structure consisting of a silicon oxide film, a silicon nitride film and a silicon oxide film on a semiconductor substrate of a first conductivity type; depositing a conductive film on the gate insulating film; patterning a photoresist at a predetermined position, where a gate electrode is to be formed, on the conductive film; selectively etching a multi-layered film consisting of the gate insulating film and the conductive film using the photoresist as a mask by a highly anisotropic etching process until the gate insulating film is exposed; oxidizing in an oxygen environment; and forming a source region and a drain region in the semiconductor substrate, each of the source region and the drain region including a first portion located under both end portions of the gate insulating film and a second portion having a thickness equal to or larger than a thickness of the first portion, where an impurity concentration in the first portion is substantially equal to an impurity concentration in the second portion.

According to still another aspect of the invention, a method for fabricating a semiconductor device is provided. The method includes the steps of: forming a gate insulating film on a semiconductor substrate of a first conductivity type; forming a gate electrode on the gate insulating film; forming L-shaped conductive films on both sides of the gate electrode and insulating films, which are not likely to diffuse oxidizing agents, on concave portions of the respective L-shaped conductive films; oxidizing portions of the sides of the L-shaped conductive films, which are not covered with the insulating films, so as to make a thickness of end portions of the gate insulating film larger than a thickness of a center portion of the gate insulating film; and forming a source region and a drain region in the semiconductor substrate, each of the source region and the drain region including a first portion located under both end portions of the gate insulating film and a second portion having a thickness equal to or larger than a thickness of the first portion, where an impurity concentration in the first portion is substantially equal to an impurity concentration in the second portion.

In one embodiment, the step of forming the gate electrode includes the steps of: depositing a first conductive film, which is undoped with an impurity, on the gate insulating film; forming on the first conductive film a photo-resist for defining a position and a shape of the gate electrode; and selectively removing an exposed portion of the first conductive film by using the photoresist as a mask by a highly anisotropic etching process. The step of forming the L-shaped conductive films and the insulating films which are not likely to diffuse oxidizing agents includes the steps of: depositing a second conductive film doped with an impurity of a second conductivity type on the gate electrode and on the semiconductor substrate; depositing an insulating film which is not likely to diffuse oxidizing agents on the second conductive film; and etching back the insulating films which are not likely to diffuse oxidizing agents and the second conductive film by a highly anisotropic etching process, thereby leaving a part of the L-shaped conductive films and a part of the insulating films which are not likely to diffuse oxidizing agents on both sides of the gate electrode.

According to still another aspect of the invention, a method for fabricating a semiconductor device is provided. The method includes the steps of: forming a gate insulating film on a semiconductor substrate of a first conductivity type; forming a gate electrode, having a multi-layered structure consisting of a first conductive film doped with ions and a second conductive film undoped with ions, on the gate insulating film; oxidizing the gate insulating film so as to form L-shaped side wall oxide films on both sides of the gate electrode so that oxide films grown on both sides of the first conductive film have a thickness larger than a thickness of oxide films grown on both sides of the second conductive film, and to make a thickness of both end portions of the gate insulating film larger than a thickness of a center portion of the gate insulating film; and forming a high-concentration diffusion layer of a second conductivity type and a high-concentration diffusion layer of the second conductivity type having a shallow junction under the L-shaped side walls in a source region and a drain region on the substrate, respectively.

According to still another aspect of the invention, a method for fabricating a semiconductor device is provided. The method includes the steps of: forming a gate insulating film on a semiconductor substrate of a first conductivity type; forming a gate electrode, having a first conductive film doped with an impurity of a second conductivity type as a lower layer and a second conductive film undoped with an impurity as an upper layer, on the gate insulating film; oxidizing the gate insulating film so as to form L-shaped side wall oxide films on both sides of the first conductive film and both sides of the second conductive film of the gate electrode by a thermal oxidization, and make a thickness of both end portions of the gate insulating film larger than a thickness of a center portion of the gate insulating film; and forming a source region and a drain region in the semiconductor substrate, each of the source region and the drain region including a first portion located on both end portions of the gate insulating film and under the L-shaped side wall oxide films and a second portion having a thickness equal to or larger than a thickness of the first portion, where an impurity concentration in the first portion is substantially equal to an impurity concentration in the second portion.

According to still another aspect of the invention, a method for fabricating a complementary MOS semiconductor device is provided. The method includes the steps of: forming an element isolation region on a main surface of a semiconductor substrate of a first conductivity type; forming a well of a second conductivity type in a predetermined island region isolated by the element isolation region; forming a gate insulating film on a region of the well; forming a high-concentration diffusion layer of the first conductivity type and a high-concentration diffusion layer of the first conductivity type having a shallow junction under the L-shaped side wall oxide films in a source region and a drain region on the well region, respectively, by using an ion implantation mask selectively formed on the substrate as a mask; and doping the gate electrode with ions of the first conductivity type in a concentration higher than a concentration of ions of the second conductivity type in the first conductive film.

According to still another aspect of the invention, a method for fabricating a semiconductor device is provided. The method includes the steps of: forming a gate insulating film on a semiconductor substrate of a first conductivity type; depositing a first conductive film doped with ions of the first conductivity type and a second conductive film undoped with ions on the gate insulating film; depositing a third conductive film on the second conductive film; patterning a photoresist at a predetermined position, where a gate electrode having a multi-layered structure consisting of the gate insulating film, the first conductive film, the second conductive film, and the third conductive film, is formed; selectively etching the multi-layered film consisting of the gate insulating film, the first conductive film, the second conductive film, and the third conductive film by using the photoresist as a mask by a highly anisotropic etching process until the gate insulating film is exposed; depositing insulating films on the substrate and on the gate electrode; selectively leaving the insulating films on both side walls of the gate electrode by a highly anisotropic etching process; oxidizing so as to make a thickness of oxide films grown on both sides of the first conductive film on both sides of the gate electrode larger than a thickness of oxide films grown on both sides of the second conductive film, and to make a thickness of both end portions of the gate insulating film larger than a thickness of a center portion of the gate insulating film; forming high-concentration diffusion layers of a second conductivity type in a source region and a drain region on the substrate by an ion implantation method; selectively etching the source region and the drain region by a highly anisotropic etching process until the substrate is exposed; silicifying the source region and the drain region on the substrate; selectively etching the third conductive film; and doping the gate electrode with ions of the second conductivity type by an ion implantation method.

According to still another aspect of the invention, a method for fabricating a complementary MOS semiconductor device is provided. The method includes the steps of: forming an element isolation region on a main surface of a semiconductor substrate of a second conductivity type; forming a well of a first conductivity type in a predetermined island region isolated by the element isolation region; forming a gate insulating film on the substrate of the second conductivity type and a region of the well of the first conductivity type; forming high-concentration diffusion layers of the first conductivity type in a source region and a drain region on the substrate of the second conductivity type by using a first ion implantation mask selectively formed on the well region of the first conductivity type as a mask by an ion implantation method; and forming high-concentration diffusion layers of the second conductivity type in the source region and the drain region on the well region of the first conductivity type by using a second ion implantation mask selectively formed on the substrate of the second conductivity type as a mask.

According to still another aspect of the invention, a method for fabricating a complementary MOS semiconductor device is provided. The method includes the steps of: forming an element isolation region on a main surface of a semiconductor substrate of a first conductivity type; forming a well of a second conductivity type in a predetermined island region isolated by the element isolation region; forming an embedded channel layer of the second conductivity type in a vicinity of a surface of the substrate, and a threshold voltage control layer of the second conductivity type in a vicinity of a surface of the well region by an ion implantation method; forming a gate insulating film on the substrate and on the well region; depositing a first conductive film and a first insulating film on the gate insulating film; patterning a photoresist at a predetermined position, where a gate electrode having a multi-layered structure consisting of the gate insulating film, the first conductive film, and the first insulating film is formed; selectively etching the multi-layered film consisting of the gate insulating film, the first conductive film and the first insulating film by using the photoresist as a mask by a highly anisotropic etching process until the gate insulating film is exposed; forming high-concentration diffusion layers of the second conductivity type in the source region and the drain region on the substrate by using an ion implantation mask selectively formed on the well region as a mask by an ion implantation method; selectively etching the first insulating film; depositing second insulating films on the substrate, the well and the gate electrode; selectively leaving the second insulating films on side walls of the gate electrode by a highly anisotropic etching process; and forming high-concentration diffusion layers of the first conductivity type in the source region and the drain region on the well by the ion implantation method and simultaneously doping the gate electrode with ions of the first conductivity type.

In one embodiment, the first conductivity type is P type.

In another embodiment, before performing the step of forming the high-concentration diffusion layers of the second conductivity type in the source region and the drain region on the substrate, low-concentration diffusion layers of the first conductivity type are formed in the source region and the drain region on the well region, and a punch through stopper layer of the first conductivity type is formed in the source region and the drain region on the substrate by the ion implantation method.

According to still another aspect of the invention, a method for fabricating a complementary semiconductor device is provided. The method includes the steps of: forming an element isolation region on a main surface of a semiconductor substrate of a first conductivity type; forming a well of a second conductivity type in a predetermined island region isolated by the element isolation region; forming an embedded channel layer of the second conductivity type in a vicinity of a surface of the substrate, and a threshold voltage control layer of the second conductivity type in a vicinity of a surface of the well region by an ion implantation method; forming a gate insulating film on the substrate and on the well region; depositing a first conductive film doped with ions of the first conductivity type and a second conductive film undoped with ions on the gate insulating film; depositing a first insulating film on the second conductive film; selectively patterning a photoresist at a predetermined position of a multi-layered film consisting of the gate insulating film, the first conductive film, the second conductive film and the first insulating film, where a gate electrode is to be formed; selectively etching the multi-layered film consisting of the gate insulating film, the first conductive film, the second conductive film and the first insulating film by using the photoresist as a mask by a highly anisotropic etching process until the gate insulating film is exposed; oxidizing so as to make a thickness of oxide films grown on both sides of the first conductive film on both sides of the gate electrode larger than a thickness of oxide films grown on both sides of the second conductive film, and to make a thickness of both end portions of the gate insulating film larger than a thickness of a center portion of the gate insulating film; forming high-concentration diffusion layers of the second conductivity type in the source region and the drain region on the substrate by using an ion implantation mask selectively formed on the well region as a mask by the ion implantation method; selectively etching the first insulating film; depositing second insulating films on the substrate, the well and the gate electrode; selectively leaving the second insulating films on the side walls of the gate electrode by a highly anisotropic etching process; and forming high-concentration diffusion layers of the first conductivity type in the source region and the drain region on the well by the ion implantation method and simultaneously doping the gate electrode with ions of the first conductivity type.

Thus, the invention described herein makes possible the advantage of providing a semiconductor device in which a gate overlapping capacitance is reduced without causing the degradation in the drive power and the increase in the short-channel effect, and a method for fabricating the same.

This and other advantages of the present invention will become apparent to those skilled in the art upon reading and understanding the following detailed description with reference to the accompanying figures.

DESCRIPTION OF THE PREFERRED EMBODIMENTS

Hereinafter, preferred embodiments of a semiconductor device and a method for fabricating the same according to the present invention will be described with reference to accompanying drawings.

Example 1 of Semiconductor Device

Figure 1:
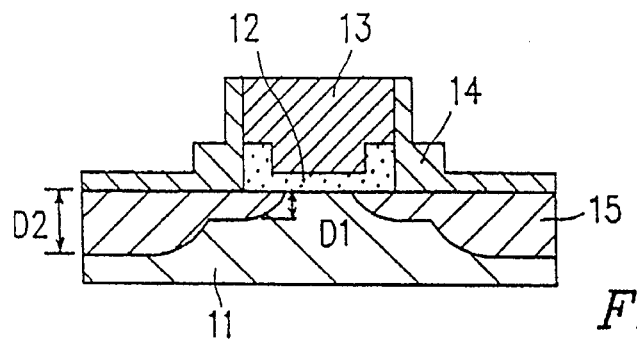
FIG. 1 is a cross-sectional view showing a semiconductor device according to a first example of the invention.

FIG. 1 is a cross-sectional view showing a semiconductor device according to a first example of the invention. As shown in FIG. 1, the semiconductor device includes: a P-type semiconductor substrate 11; a gate oxide film 12 formed on the P-type semiconductor substrate 11; a gate electrode 13 provided on the P-type semiconductor substrate 11 via the gate oxide film 12; L-shaped side wall oxide films 14 formed on both sides of the gate electrode 13; and N-type high-concentration source/drain diffusion layers 15 provided in a source region and a drain region of the P-type semiconductor substrate 11.

The thickness of both end portions of the gate oxide film 12 is set to be larger than that of the center portion thereof. For example, in the case where the thickness of the center portion is 6 nm, the thickness of both end portions is set to be in an approximate range of 10 to 50 nm. In the case where the width (a dimension measured along the channel-length direction) of the gate electrode 13 is 300 nm, for example, the width (a dimension measured along the channel-length direction) of each of the end portions with a relatively large thickness of the gate oxide film 12 is in an approximate range of 20 to 70 nm. On the other hand, the width (a dimension measured along the channel-length direction) of the flat center portion with a relatively small thickness of the gate oxide film 12 is in an approximate range of 160 to 260 nm.

A junction depth D1 of the high-concentration source/drain diffusion layers 15 located under the L-shaped side wall oxide films 14 and both end portions with a relatively large thickness of the gate oxide film 12 is set to be smaller than a junction depth D2 of the high-concentration source/drain diffusion layers 15 located in the other regions. Accordingly, it is possible to effectively suppress the diffusion of the electric field extending from the source/drain diffusion layers 15 towards the channel direction, and effectively suppress the reduction in threshold voltage (Vt) characteristic of a fine MOSFET. The depth D1 is preferably in a range of 50 to 100 nm, while the depth D2 is preferably in a range of 100 to 150 nm.

The impurity concentration in the portion having the junction depth D1 of the high-concentration source/drain diffusion layers 15 is substantially equal to the impurity concentration in the portion having the junction depth D2, e.g., in a range of $1 \times 10^{19}$ cm$^{-3}$ to $1 \times 10^{20}$ cm$^{-3}$. Since the impurity concentration of an LDD is generally in a range of $1 \times 10^{18}$ cm$^{-3}$ to $1 \times 10^{19}$ cm$^{-3}$ or less, the impurity concentration in the portion with the depth D1 is different from that of the LDD. Not the LDD but the end portions of the high-concentration source/drain diffusion layers 15 extend to the portions located under both end portions with a large thickness of the gate oxide film 12. Therefore, it is possible to reduce the gate-drain capacitance and the gate-source capacitance without reducing the drain current.

Example 2 of Semiconductor Device

Figure 2:
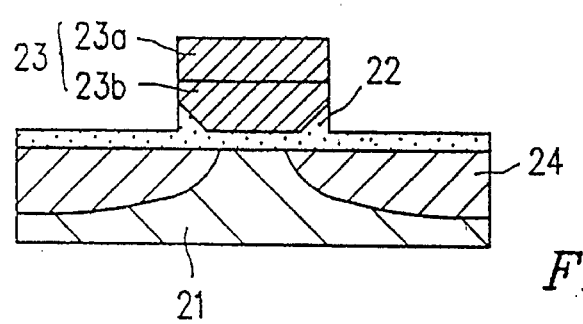
FIG. 2 is a cross-sectional view showing a semiconductor device according to a second example of the invention.

FIG. 2 is a cross-sectional view showing a semiconductor device according to a second example of the invention. As shown in FIG. 2, the semiconductor device includes: a P-type semiconductor substrate 21; a gate oxide film 22 formed on the P-type semiconductor substrate 21; a gate electrode 23 provided on the P-type semiconductor substrate 21 via the gate oxide film 22; and N-type high-concentration source/drain diffusion layers 24 provided in a source region and a drain region in the P-type semiconductor substrate 21.

A typical feature of this second example shown in FIG. 2 lies in that the gate electrode 23 has a two-layered structure consisting of a polycrystalline silicon film 23b and an amorphous silicon film 23a. The existence of the amorphous silicon film 23a effectively prevents the diffusion of B (boron) from the polycrystalline silicon film 23b into the semiconductor substrate 21 which adversely occurs in a dual-gate technology. The gate electrode itself consisting of the two layers is disclosed by H.-H. Tseng et al., in 1990 Digest of the Intl. Symposium on VLSI Technology, pp. 111–112.

In the same way as the first example, the high-concentration source/drain diffusion layers 24 extend to the portions located under both end portions with a large thickness of the gate oxide film 22. Therefore, it is possible to reduce the gate-drain capacitance and the gate-source capacitance without reducing the drain current.

Example 3 of Semiconductor Device

Figure 3:
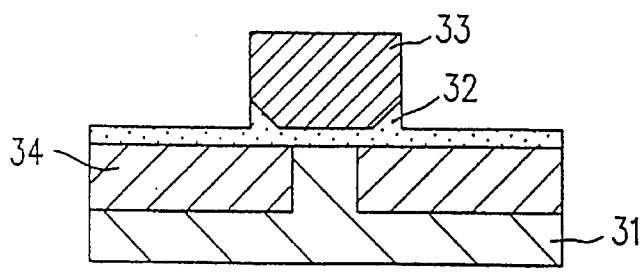
FIG. 3 is a cross-sectional view showing a semiconductor device according to a third example of the invention.

FIG. 3 is a cross-sectional view showing a semiconductor device according to a third example of the invention. As shown in FIG. 3, the semiconductor device includes: an SOI substrate 31; a gate oxide film 32 formed on the SOI substrate 31; a gate electrode 33 provided on the SOI substrate 31 via the gate oxide film 32; and N-type high-concentration source/drain diffusion layers 34 provided in a source region and a drain region in the SOI substrate 31.

A typical feature of this third example shown in FIG. 3 lies in that the high-concentration source/drain diffusion layers 34 extend to the portions located under both end portions with a large thickness of the gate oxide film 32. Accordingly, it is possible to reduce the gate-drain capacitance and the gate-source capacitance without reducing the drain current. In a MOSFET formed on a substrate having an SOI structure, the proportion of the junction capacitance in the delay time is much smaller than the proportion of the gate capacitance in the delay time. On the other hand, when the MOSFET is operated at a low voltage, the proportion of the gate-drain capacitance, functioning as a mirror capacitance, in the delay time is very large. Therefore, if the MOSFET formed on the substrate having such an SOI structure has a T-shaped gate structure, then the gate-drain capacitance can be reduced, thereby much improving the delay time.

Example 1 of Fabrication Method

Referring to FIGS. 4A to 4G, a method for fabricating a semiconductor device according to an example of the invention will be described.

Figure 4A:
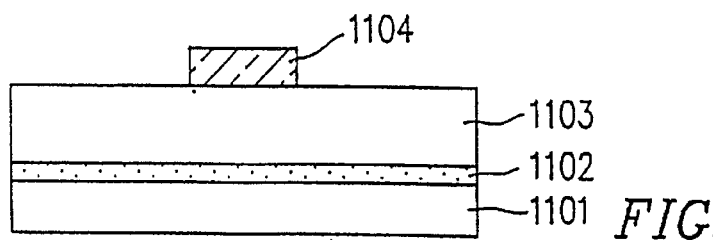
FIGS. 4A to 4G are cross-sectional views showing respective process steps of a method for fabricating a semiconductor device according to the first example of the invention.

First, as shown in FIG. 4A, a gate oxide film 1102 having a thickness of about 8 nm is formed on a P-type semiconductor substrate 1101, and then an undoped polycrystalline silicon film 1103 is deposited on the gate oxide film 1102 so as to be approximately 330 nm thick. Thereafter, a photoresist 1104 for defining the shape and the position of the gate electrode 1106 is formed in a selected region on the polycrystalline silicon film 1103.

Figure 4B:
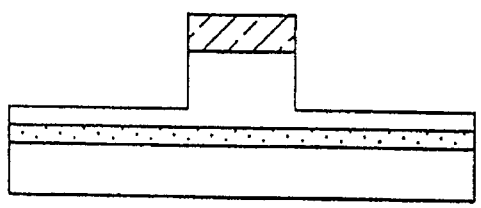

Next, as shown in FIG. 4B, a highly anisotropic etching process is performed in a vertical direction by using the photoresist 1104 as a mask. By performing this etching process, all the portions of the polycrystalline silicon film 1103, excluding the porion to be used as the gate electrode 1106, are etched into an approximate depth of 90 nm.

Figure 4C:
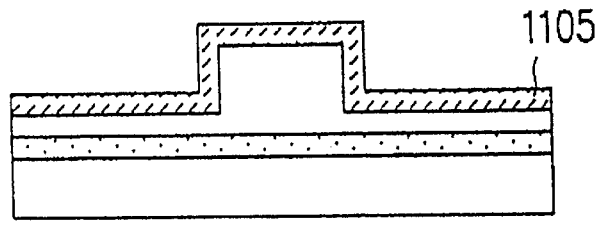

Subsequently, as shown in FIG. 4C, the photoresist 1104 is removed, and then a silicon nitride film 1105 (thickness: about 5 nm) is deposited on the polycrystalline silicon film 1103 as a film which is not likely to diffuse oxidizing agents.

Figure 4D:
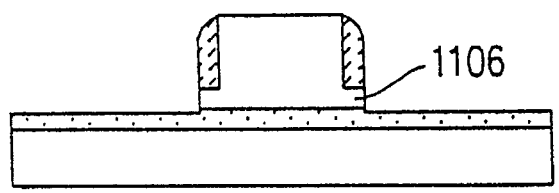

Then, as shown in FIG. 4D, a multi-layered film consisting of the gate oxide film 1102, the polycrystalline silicon film 1103 and the silicon nitride film 1105 is etched by a highly anisotropic etching process in a vertical direction. The etching process is performed so that the silicon nitride film 1105 is left on the sides of the gate electrode 1106 and that the gate oxide film 1102 is exposed. As a result, the gate electrode 1106 is formed. In this stage, the upper portions on the sides of the gate electrode 1106 are covered with the silicon nitride film 1105, while the lower portions on the sides are exposed. The height of the exposed lower portions is approximately 90 nm.

Figure 4E:
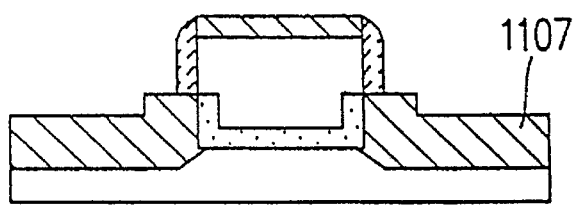

Next, a thermal oxidization process is performed at 850° C. for 70 minutes in a wet environment, thereby growing thermal oxide films 1107 on the sides of the gate electrode 1106 not covered with the silicon nitride film 1105 so as to be about 60 nm thick, as shown in FIG. 4E. The thermal oxide films 1107 have grown outwards in a horizontal direction from the sides of the gate electrode 1106 by about 30 nm, and have also grown inwards therefrom by about 30 nm. By performing this thermal oxidization process, an oxide film 1107 having a thickness of about 60 nm (measured along the direction vertical with respect to the main surface of the substrate 1101) has also grown on the substrate 1101. Hereinafter, the thickness of the oxide films 1107 formed by this thermal oxidization process will be called a "thickness of re-oxidized films". In this example, the thickness of the re-oxidized films is about 60 nm.

Figure 4F:
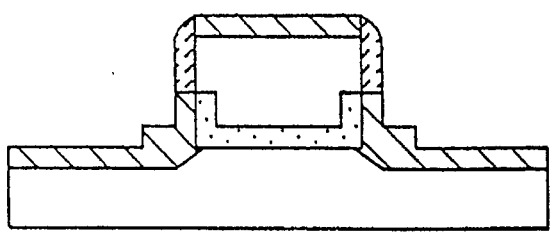

Thereafter, as shown in FIG. 4F, the oxide films 1107 are etched from the upper surface thereof into a depth of about 60 nm by performing a highly anisotropic etching process in a vertical direction. As a result, the thickness (measured along the direction parallel to the main surface of the substrate 1101) of the oxide films 1107 on the sides of the gate electrode 1106 becomes about 30 nm.

Figure 4G:
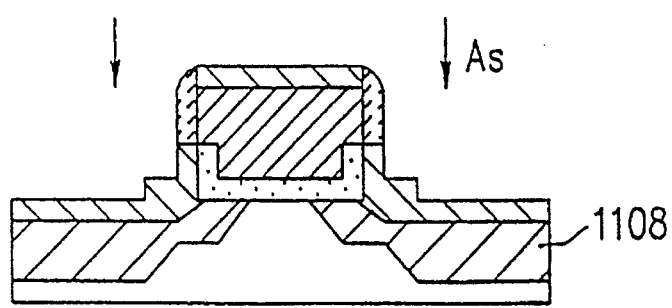

Finally, as shown in FIG. 4G, As ions or the like are implanted as N-type impurity ions into the substrate 1101 at an implant energy of 80 KeV and at an implant dose of about $6\times10^{15}$ cm$^{-2}$, and then a heat treatment is performed at 850° C., thereby forming N-type high-concentration diffusions layer 1108 in a source region and a drain region in the P-type substrate 1101. In the regions located under the L-shaped side walls, the N-type high-concentration diffusion layers 1108 have a junction shallower than that in the other regions. This is because the impurity ions diffusing through the L-shaped side walls into the substrate 1101 are distributed at the positions shallower than the positions of the impurity ions diffusing through the flat portion with a relatively small thickness of the oxide films 1107 into the substrate 1101. By performing the heat treatment after the ion implantation, the impurity ions diffuse vertically and horizontally. Therefore, the impurity ions diffusing through the L-shaped side walls into the substrate 1101 diffuse towards the region just under the center of the gate electrode 1106.

The implantation of the impurity ions is performed not only into the N-type high-concentration diffusion layers 1108, but also into the gate electrode 1106, thereby obtaining an N-type poly-silicon gate electrode 1106.

In the case where a doped polycrystalline silicon film is used in place of the undoped polycrystalline silicon film 1103 during the process step as shown in FIG. 4A, the time period during which the oxidization is performed is shortened. This is because the oxidization rate of the doped polycrystalline silicon film is higher than that of the undoped polycrystalline silicon film 1103. If the oxidization time period is shortened, then the resulting thickness of the oxide film grown on the substrate 1101 becomes as small as about 15 nm, for example. Therefore, it is no longer necessary to perform an etching process shown in FIG. 4F. In the case where the etching process shown in FIG. 4F is not performed, the oxide films 1107 located on the sides of the gate electrode 1106 which are not covered with the silicon nitride film 1105 are left being largely projected from the sides of the gate electrode 1106 in a lateral direction, so that the offset between the source and the drain becomes large. In order to reduce the amount of this offset, the etching shown in FIG. 4B is required to be performed until the thickness of the polycrystal-line silicon film 1103 becomes about 40 nm.

According to the fabrication method described above, the semiconductor device shown in FIG. 1 can be fabricated easily. In particular, the gate oxide film whose thickness increases on both end portions thereof, and the L-shaped side wall oxide films for forming the high-concentration impurity diffusion layers having different junction depths can be formed easily by performing a single thermal oxidization process step.

The short-channel effects of the semiconductor device thus formed and those of a conventional semiconductor device are estimated in comparison by using a process/device simulation. The estimation results will be described with reference to FIGS. 5A and 5B and FIG. 6.

Figure 5A:
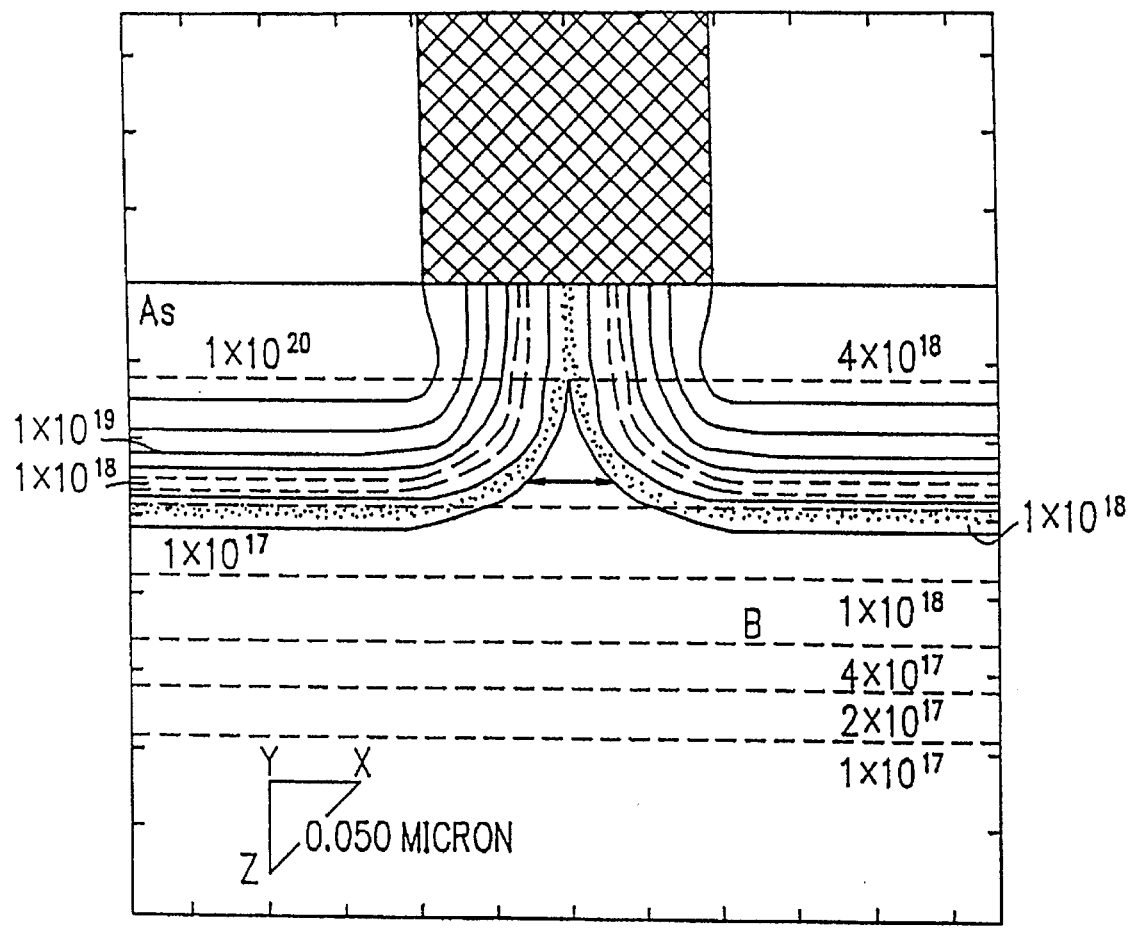
FIGS. 5A and 5B are cross-sectional views schematically showing in comparison a profile of an Nch MOSFET of the invention and a profile of a conventional Nch MOSFET.
Figure 5B:
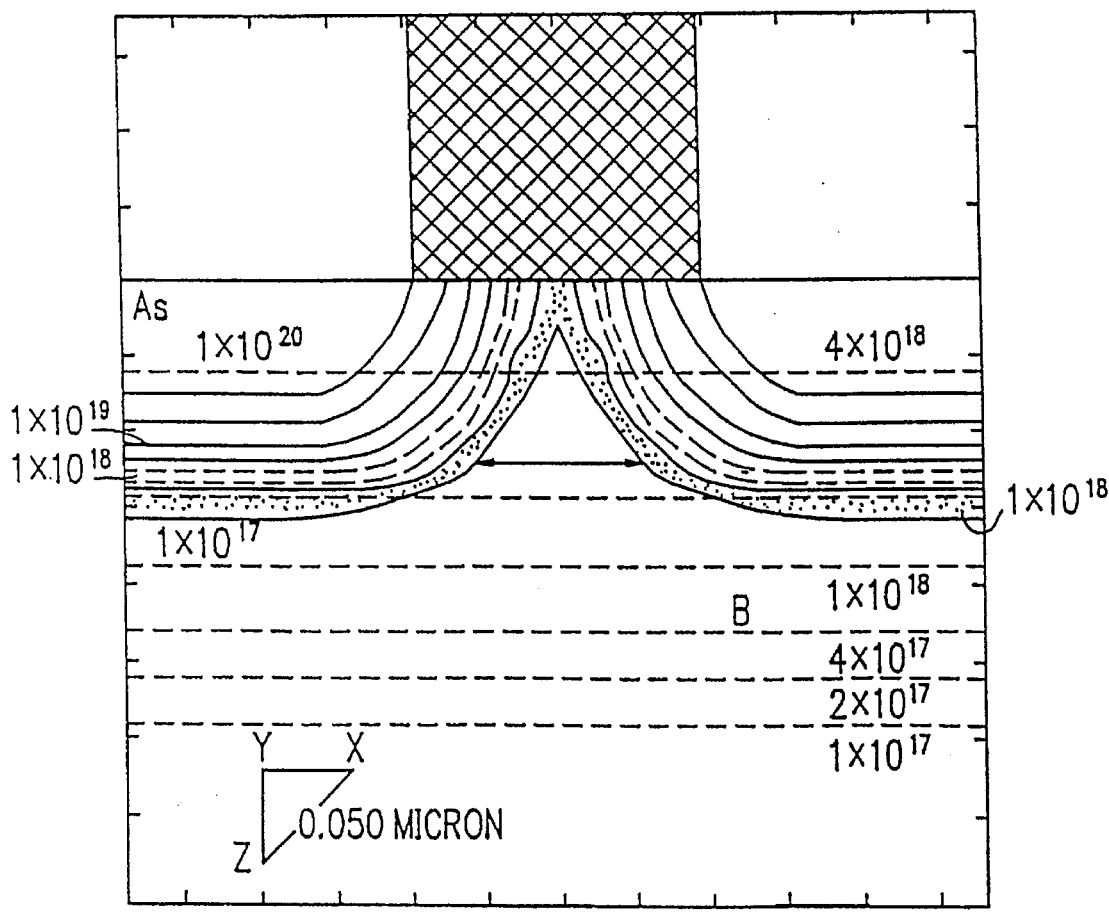

FIGS. 5A and 5B are cross-sectional views respectively showing in comparison a profile of an Nch MOSFET of the invention and a profile of a conventional Nch MOSFET. The gate length is 0.2 μm, and the thickness of the oxide film is 4 nm. The N-type high-concentration source/drain diffusion layers are formed by implanting As ions, the threshold voltage (Vt) is controlled by implanting B (boron) ions, and a punch through stopper is also formed by implanting B (boron) ions.

In FIGS. 5A and 5B, the profile curves showing the concentrations of boron (B) indicate $1\times10^{17}$ cm$^{-3}$, $2\times10^{17}$ cm$^{-3}$, $4\times10^{18}$ cm$^{-3}$, $1\times10^{18}$ cm$^{-3}$, $2\times10^{18}$ cm$^{-3}$, and $4\times10^{18}$ cm$^{-3}$, sequentially from the lowermost portion to the uppermost portion of the substrate, respectively. On the other hand, the profile curves showing the concentrations of arsenic (As) indicate $1\times10^{17}$ cm$^{-3}$, $2\times10^{17}$ cm$^{-3}$, $4\times10^{17}$ cm$^{-3}$, $1\times10^{18}$ cm$^{-3}$, $2\times10^{18}$ cm$^{-3}$, $4\times10^{18}$ cm$^{-3}$, $1\times10^{19}$ xm$^{-3}$, $2\times10^{19}$ cm$^{-3}$, $4\times10^{19}$ cm$^{-3}$, and $1\times10^{20}$ cm$^{-3}$, sequentially from the center portion of the channel under the gate to the source/drain diffusion layers, respectively.

As shown in FIGS. 5A and 5B, the distance between the diffusion layer in the source region and the diffusion layer in the drain region is not so long at a deep position inside the substrate in a conventional Nch MOSFET, while the distance therebetween is sufficiently long in an Nch MOSFET of the invention. In addition, the high-concentration portions ($1\times10^{20}$ cm$^{-3}$) in the source/drain diffusion layers are located at the same positions under both end portions of the gate, and the effective gate length is also approximately the same. Consequently, according to the invention, it is possible to remarkably improve the short channel effects while substantially maintaining the driving power, as compared with a conventional example.

Figure 6:
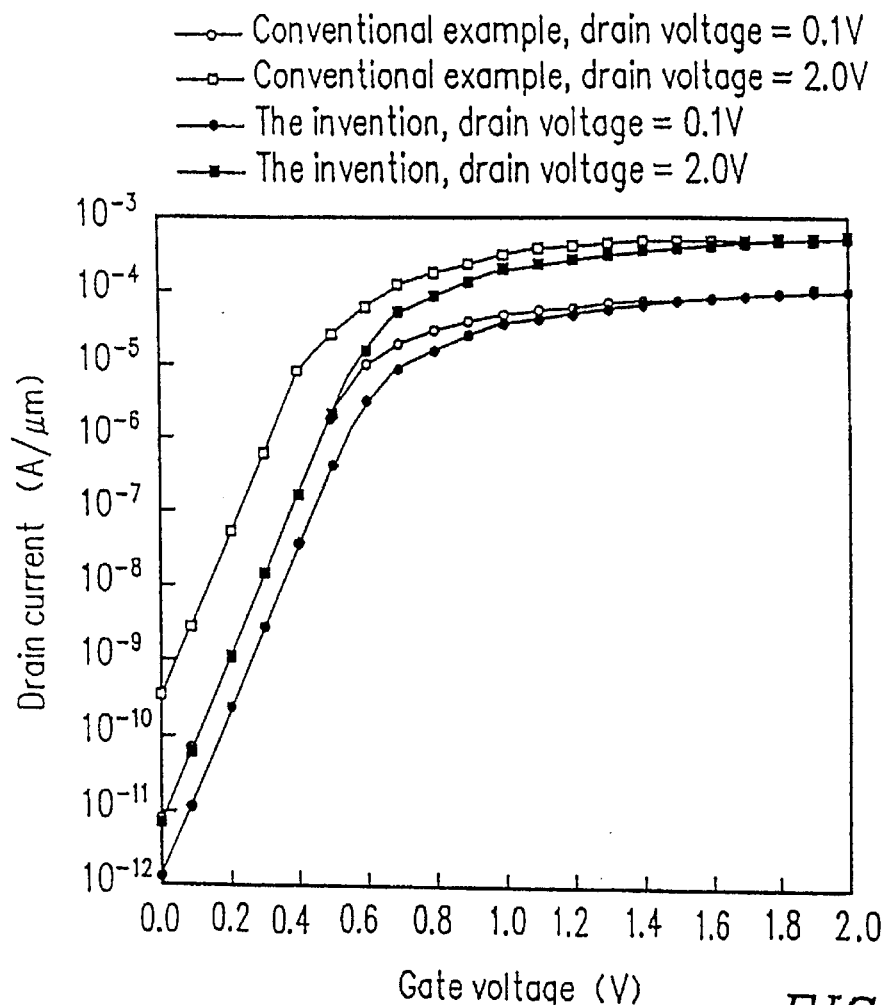
FIG. 6 is a graph showing in comparison subthreshold characteristics of the invention and those of a conventional example.

FIG. 6 is a graph showing in comparison subthreshold characteristics of the Nch MOSFET of the invention having the impurity concentration profile shown in FIG. 5B and those of a conventional Nch MOSFET having the impurity concentration profile shown in FIG. 5A. The abscissas indicate the gate voltages, and the ordinates indicate the drain currents corresponding to the drain voltages of 0.1 V and 1.5 V. The threshold voltage is a gate voltage corresponding to a drain current of 0.25 uA. As shown in FIG. 6, in a conventional example, the difference between the threshold voltage corresponding to the drain voltage of 0.1 V and the threshold voltage corresponding to the drain voltage of 1.5 V is 0.25 V or more, and the short-channel effects are considerably degraded. However, according to the invention, the difference between the threshold voltage corresponding to the drain voltage of 0.1 V and the threshold voltage corresponding to the drain voltage of 1.5 V is approximately 0.10 V, and the short-channel effects has been remarkably improved.

Example 2 of Fabrication Method

Referring to FIGS. 7A to 7G, a method for fabricating a semiconductor device according to another example of the invention will be described.

First, as shown in FIG. 4A, a gate oxide film 1202 having a thickness of about 8 nm is formed on an N-type semiconductor substrate 1201, and then an undoped polycrystalline silicon film 1203 (thickness: 90 nm) and an amorphous silicon film 1204 (thickness: 240 nm) are deposited on the gate oxide film 1202. Thereafter, a photoresist 1205 for defining the shape and the position of the gate electrode 1207 is formed in a selected region on the amorphous silicon film 1204.

Figure 7A:
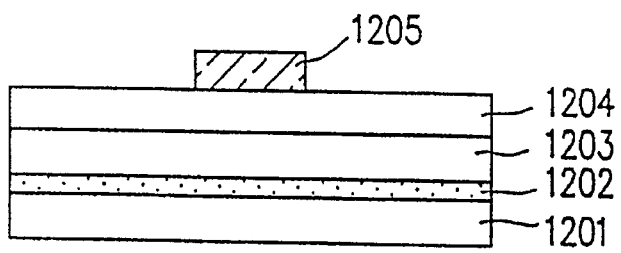
FIGS. 7A to 7G are cross-sectional views showing respective process steps of a method for fabricating a semiconductor device according to the second example of the invention.
Figure 7B:
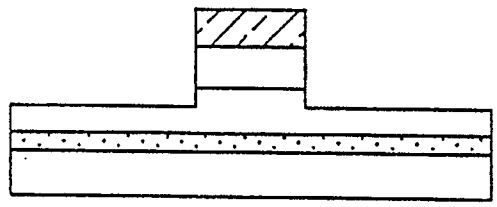

Next, as shown in FIG. 7B, a highly anisotropic etching process is performed in a vertical direction by using the photoresist 1205 as a mask. By performing this etching process, the amorphous silicon film 1204 and the polycrystalline silicon film 1203 are etched so that the exposed portions thereof become approximately 90 nm thick.

Figure 7C:
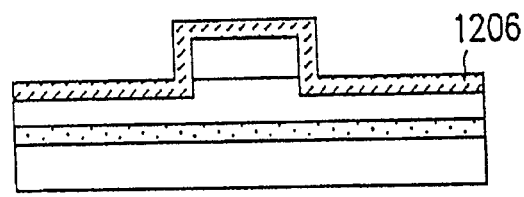

Subsequently, as shown in FIG. 7C, the photoresist 1205 is removed, and then a silicon nitride film 1206 (thickness: about 5 nm) is deposited thereon as a film which is not likely to diffuse oxidizing agents.

Figure 7D:
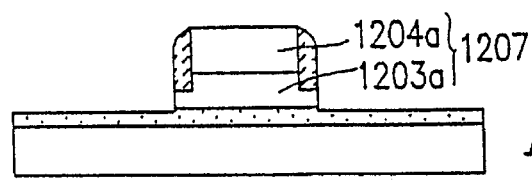

Then, as shown in FIG. 7D, a multi-layered film consisting of the gate oxide film 1202, the polycrystalline silicon film 1203 and the silicon nitride film 1206 is etched by a highly anisotropic etching process in a vertical direction. The etching process is performed so that the silicon nitride films 1206 are left on the sides of a gate electrode 1207 and that the gate oxide film 1202 is exposed. As a result, the gate electrode 1207 including the polycrystalline silicon film 1203a and the amorphous silicon film 1204a is formed.

Figure 7E:
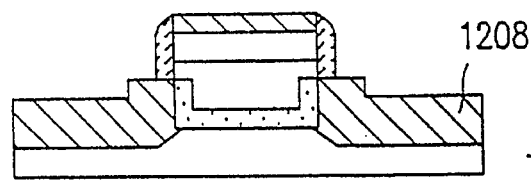

Next, as shown in FIG. 7E, oxide films 1208 are grown on the sides of the gate electrode 1207 where the silicon nitride films 1206 are not left by about 60 nm, i.e., in an outward direction (30 nm) and in an inward direction (30 nm) from both ends of the gate, and at the same time, the gate oxide film 1202 is oxidized in an oxygen environment so that both end portions of the gate oxide film 1202 have a thickness larger than the thickness of the center portion thereof. As a result, the oxide film 1208 having a thickness of about 60 nm is grown on the substrate 1201. The oxidization is performed at 850° C. for about 70 minutes in a wet environment.

Figure 7F:
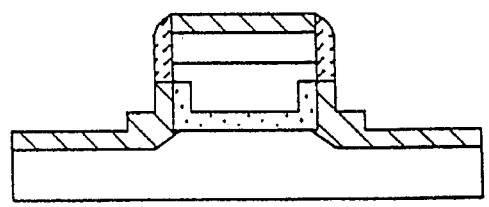

Thereafter, as shown in FIG. 7F, the oxide films 1208 are etched into a depth of about 60 nm by performing a highly anisotropic etching process in a vertical direction. As a result, the thickness of the oxide films 1208 on the sides of the gate electrode 1207 where the silicon nitride films 1206 are not left becomes about 30 nm.

Figure 7G:
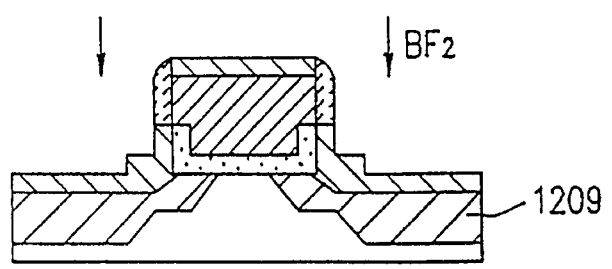

Finally, as shown in FIG. 7G, $BF_2$ ions or the like are implanted as P-type impurity ions into the substrate 1201 at an implant energy of 40 KeV and at an implant dose of about $4 \times 10^{15}$ $cm^{-2}$, and then a heat treatment is performed at 850° C., so as to form a P-type high-concentration diffusion layer 1209 and a P-type high-concentration diffusion layer 1209 which has a shallow junction under the oxide films 1208 formed on the sides of the gate electrode 1207 where the silicon nitride films 1206 are not left in the N-type substrate 1201. At the same time, by doping the gate electrode 1207 with $BF_2$ ions, a P-type poly-silicon gate electrode 1207 is formed.

In the case where a doped polycrystalline silicon film is used in place of the undoped polycrystalline silicon film 1203 during the process step as shown in FIG. 7A, the time period during which the oxidization is performed is shortened in the process step as shown in FIG. 7E. As a result, the thickness of the oxide film grown on the substrate 1201 becomes as small as about 15 nm, for example. Therefore, it is no longer necessary to perform the process step shown in FIG. 7F. In order to reduce the amount of the offset between the source and the drain owing to the oxide films 1208 on the sides of the gate electrode 1207 where the silicon nitride films 1206 are not left, the etching shown in FIG. 7B is required to be performed so that the polycrystalline silicon film 1203, other than the gate electrode 1207, is also etched so as to be about 40 nm thick.

Example 3 of Fabrication Method

Referring to FIGS. 8A to 8G, a method for fabricating a semiconductor device according to still another example of the invention will be described.

Figure 8A:
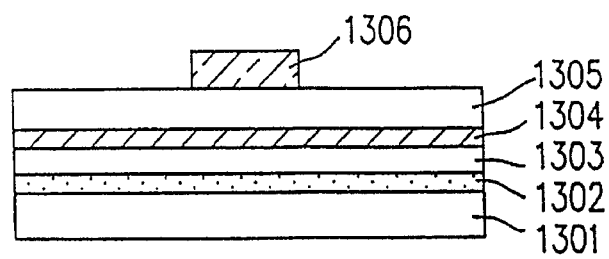
FIGS. 8A to 8G are cross-sectional views showing respective process steps of a method for fabricating a semiconductor device according to the third example of the invention.

First, as shown in FIG. 8A, a gate oxide film 1302 having a thickness of about 7 nm is formed on an N-type semiconductor substrate 1301, and then an undoped polycrystalline silicon film 1303 (thickness: 90 nm) is deposited on the gate oxide film 1302. Then, a native oxide film 1304 is formed on the polycrystalline silicon film 1303, and an amorphous silicon film 1305 (thickness: about 240 nm) is deposited thereon. The native oxide film 1304 is formed by exposing the deposited polycrystalline silicon film 1303 to the atmosphere. The thickness of the native oxide film 1304 is desirably in a range of 2 to 5 nm.

Figure 8B:
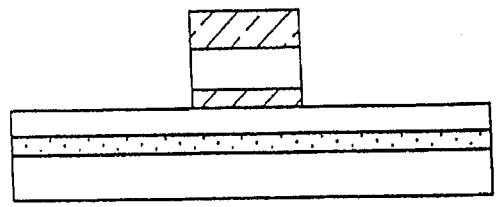

Thereafter, a photoresist 1306 for defining the shape and the position of the gate electrode 1308 is formed on the amorphous silicon film 1305. As shown in FIG. 8B, by selectively performing a highly anisotropic etching process in a vertical direction by using the photoresist 1306 as a mask, the amorphous silicon film 1305 and the native oxide film 1304 are etched, so that all the portions of the polycrystalline silicon film 1303, excluding the portions to be used as the gate electrode 1308, become about 70 nm thick. In this case, by setting the etching selection ratios of the amorphous silicon film 1305 and the native oxide film 1304 to be larger, and by detecting $SiO_2$ during etching the native oxide film 1304, the etching can be performed so that only the polycrystalline silicon film 1303 is left.

Figure 8C:
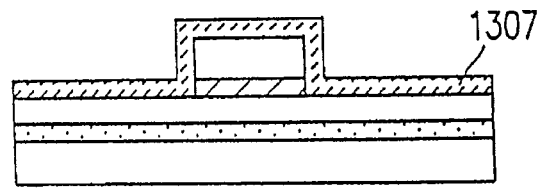

Subsequently, as shown in FIG. 8C, the photoresist 1306 is removed, and then a silicon nitride film 1307 (thickness: about 5 nm) which is not likely to diffuse oxidizing agents is deposited thereon.

Figure 8D:
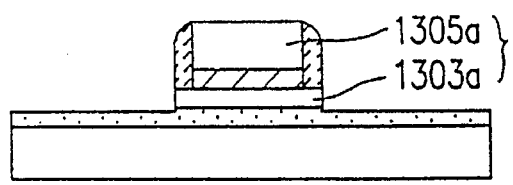

Then, as shown in FIG. 8D, a multi-layered film consisting of the gate oxide film 1302, the polycrystalline silicon film 1303 and the silicon nitride film 1307 is etched by a highly anisotropic etching process in a vertical direction. The etching process is performed until the gate oxide film 1302 is exposed so that the silicon nitride films 1307 are left on the sides of a gate electrode 1308. As a result, the gate electrode 1308 including the polycrystalline silicon film 1303a and the amorphous silicon film 1305a is formed.

Figure 8E:
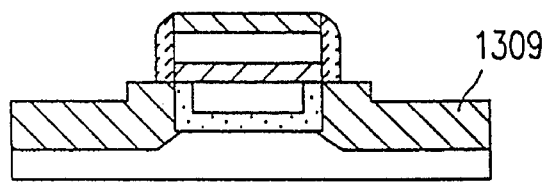

Next, as shown in FIG. 8E, oxide films 1309 are grown on the sides of the gate electrode 1308 where the silicon nitride films 1307 are not left by about 60 nm, i.e., in an outward direction (30 nm) and in an inward direction (30 nm) from both ends of the gate, and at the same time, the gate oxide film 1302 is oxidized in an oxygen environment so that both end portions of the gate oxide film 1302 have a thickness larger than the thickness of the center portion thereof. As a result, the oxide film 1309 having a thickness of about 60 nm is grown on the substrate 1301. The oxidization is performed at 850° C. for about 70 minutes in a wet environment.

Figure 8F:
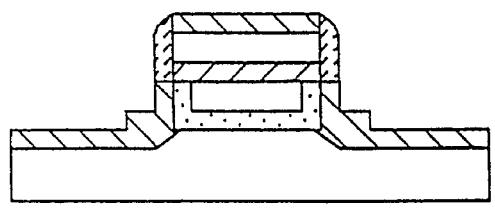

Thereafter, as shown in FIG. 8F, the oxide film 1309 grown on the substrate 1301 during the process step as shown in FIG. 8E is etched by about 90 nm by selectively performing a highly anisotropic etching process in a vertical direction. As a result, the thickness of the oxide films 1309 on the sides of the gate electrode 1308 where the silicon nitride films 1307 are not left becomes about 30 nm.

Figure 8G:
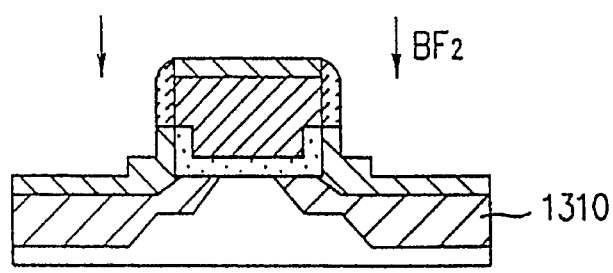

Finally, as shown in FIG. 8G, $BF_2$ ions or the like are implanted as P-type impurity ions into the substrate 1301 at an implant energy of 40 KeV and at an implant dose of about $4 \times 10^{15}$ $cm^{-2}$, and then a heat treatment is performed at 850° C., thereby forming P-type high-concentration diffusion layers 1310 in the N-type substrate 1301. At the same time, by doping the gate electrode 1308 with $BF_2$ ions, a P-type poly-silicon gate electrode 1308 is formed. The P-type high-concentration diffusion layers 1310 have a similar profile to that of the N-type high-concentration diffusion layers 15 shown in FIG. 1.

In the case where a doped polycrystalline silicon film is used in place of the undoped polycrystalline silicon film 1303 during the process step as shown in FIG. 8A, the time period during which the oxidization is performed is shortened in the process step as shown in FIG. 8E. As a result, the thickness of the oxide film grown on the substrate 1301 becomes as small as about 15 nm, for example. Therefore, it is no longer necessary to perform the process step shown in FIG. 8F. In order to reduce the amount of the offset between the source and the drain owing to the oxide films 1309 on the sides of the gate electrode 1308 where the silicon nitride films 1307 are not left, the etching shown in FIG. 8B is required to be performed so that the polycrystalline silicon film 1303, other than the gate electrode 1308, is also etched so as to be about 40 nm thick.

According to the method of this example, the following advantages can be obtained. (1) Since the oxide films are not grown on the entire surfaces of the side walls of the gate electrode, the reduction in the effective channel length can be prevented and the driving power is increased. (2) The L-shaped side wall structure suppresses the short-channel effects. (3) The diffusion of boron (B) from the P-type poly-silicon into a bulk, which adversely occurs in a dual-gate technology, can be effectively prevented. A semiconductor device realizing the above advantages can be fabricated easily in a self-aligning manner by monitoring $SiO_2$ to be detected during the etching process.

Example 4 of Fabrication Method

Referring to FIGS. 9A to 9D, a method for fabricating a semiconductor device according to still another example of the invention will be described.

Figure 9A:
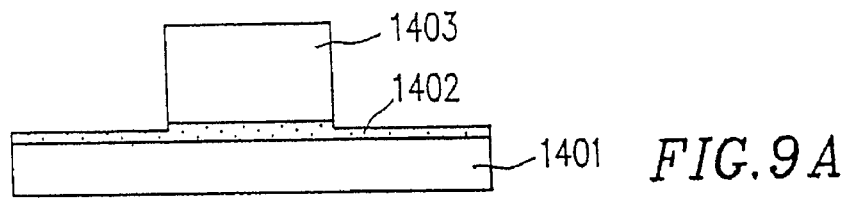
FIGS. 9A to 9D are cross-sectional views showing respective process steps of a method for fabricating a semiconductor device according to a fourth example of the invention.

First, as shown in FIG. 9A, a gate oxide film 1402 having a thickness of about 8 nm is formed on a P-type semiconductor substrate 1401, and then an undoped polycrystalline silicon film (thickness: about 330 nm) is deposited on the gate oxide film 1402. Thereafter, a photoresist for defining the shape and the position of the gate electrode 1403 is formed in a selected region on the polycrystalline silicon film. Then, by selectively performing a highly anisotropic etching process in a vertical direction, the polycrystalline silicon film is etched until the gate oxide film 1402 is exposed, thereby forming the gate electrode 1403.

Figure 9B:
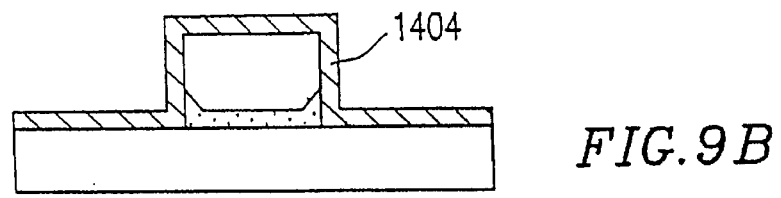
Figure 9C:
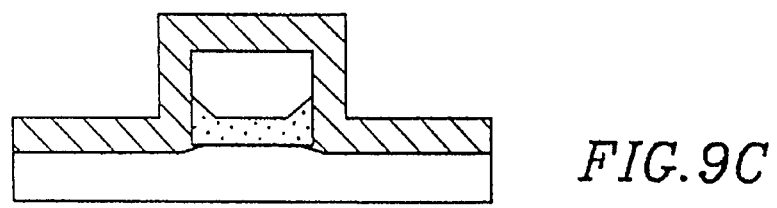

Next, as shown in FIG. 9B, the gate electrode 1403 is thermally oxidized at 850° C. for about 20 minutes in a dry oxygen environment containing no steam and no hydrogen. By performing this oxidization, side wall oxide films 1404 are formed on the upper surface and the side surfaces of the gate electrode 1403, and both end portions of the gate oxide film 1402 become thick. As a result, the bottom end portions of the gate electrode 1403 become round-shaped. The oxidization in the dry oxygen environment is suitable for abruptly increasing the thickness of both end porions of the gate oxide film 1402.

Subsequently, the gate electrode 1403 is thermally oxidized at 850° C. for about 10 minutes in a wet oxygen environment containing steam and hydrogen. By performing this second oxidization process step, the bottom end portions of the gate electrode 1403 are further oxidized so as to be in a shape resembling a bird's beak in a local oxidation of silicon (LOCOS). This is because oxygen is supplied to the bottom of the gate electrode 1403 via the gate oxide film 1402. The oxidization in a wet oxygen environment proceeds in a direction parallel to the main surface of the substrate and makes larger the width of both end portions of the gate oxide film 1402 with a larger thickness as compared with that of the other portions. In other words, the resulting "bird's beak" extends in an elongated shape towards the center of the bottom of the gate electrode 1403.

Figure 9D:
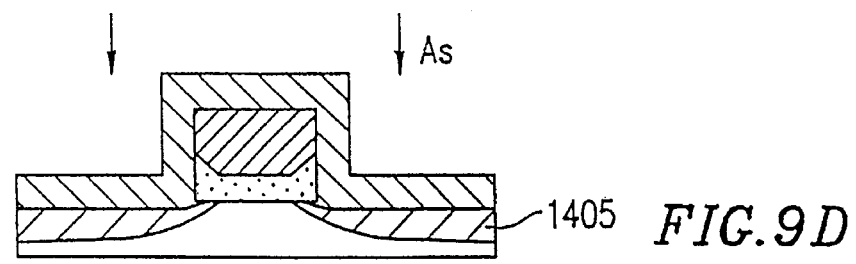

Finally, as shown in FIG. 9D, arsenic (As) ions or the like are implanted as N-type impurity ions into the substrate 1401 at an implant energy of 80 KeV and at an implant dose of about $6\times10^{15}$ cm$^{-2}$, and then a heat treatment is performed at 850° C., thereby forming N-type high-concentration diffusion layers 1405 in source region and the drain region in the P-type substrate 1401. By performing this ion implantation, the gate electrode 1402 is also doped with impurity ions.

According to the method of this example, the dry oxidization increases the height of the bird's beak oxide film located on the bottom of the gate electrode, and the wet oxidization extends the bird's beak oxide film inwards. Consequently, it is possible to fabricate a semiconductor device having a T-shaped gate structure in a satisfactory production yield.

Example 5 of Fabrication Method

Referring to FIGS. 10A to 10E, a method for fabricating a semiconductor device according to still another example of the invention will be described.

Figure 10A:
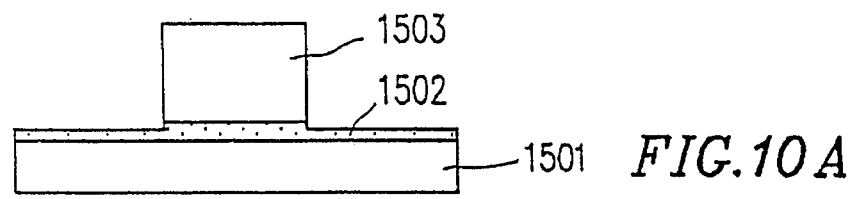
FIGS. 10A to 10E are cross-sectional views showing respective process steps of a method for fabricating a semiconductor device according to a fifth example of the invention.

First, as shown in FIG. 10A, a gate electrode 1503 (thickness: about 330 nm) constituted by an undoped polycrystalline silicon film is formed on a P-type semiconductor substrate 1501 via a gate oxide film 1502 having a thickness of about 8 nm.

Figure 10B:
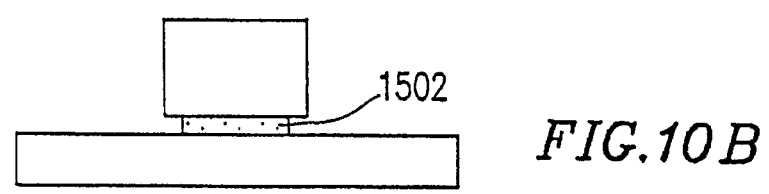

Next, as shown in FIG. 10B, the gate oxide film 1502 under both ends of the gate electrode 1503 is etched by an isotropic wet etching using fluorine.

Figure 10C:
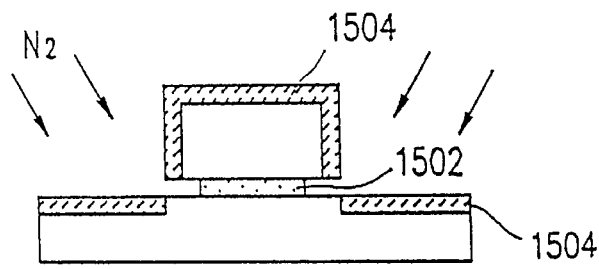

Subsequently, as shown in FIG. 10C, nitrogen ions are implanted into the source region and the drain region in the substrate 1501 and onto the surface of the gate electrode 1503 at an implant energy of 2 KeV and at an implant dose of about $4\times10^{13}$ cm$^{-2}$, and then a heat treatment is performed at 850° C. in a nitrogen environment, thereby reacting silicon with nitrogen. As a result, silicon nitride films 1504 are formed on the surfaces of the source region and the drain region in the substrate 1501 and on the surface of the gate electrode 1503.

Figure 10D:
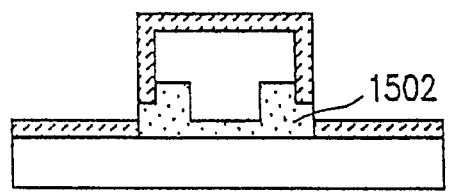

Then, by oxidizing the gate electrode 1503 in an oxygen environment, both end portions of the gate oxide film 1502 become thicker than the center portion of the gate oxide film 1502, as shown in FIG. 10D.

Figure 10E:
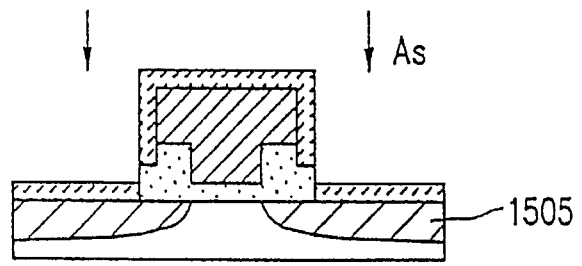

Next, as shown in FIG. 10E, arsenic (As) ions or the like are implanted as N-type impurity ions into the substrate 1501 at an implant energy of 80 KeV and at an implant dose of about $6\times10^{15}$ cm$^{-2}$, and then a heat treatment is performed at 850° C., thereby forming N-type high-concentration diffusion layers 1505 in the source region and the drain region in the P-type substrate 1501. By performing this process steps, the gate electrode 1503 is doped with As ions simultaneously, so that an N-type poly-silicon gate electrode 1503 is formed.

According to the method of this example, since the silicon nitride films are formed on the side walls of the gate electrode, the oxide films are not grown on the entire surfaces of the sides of the gate electrode. Therefore, the reduction in the effective channel length can be prevented and the driving power can be increased. In addition, since the silicon nitride film is formed on the surface of the substrate, the oxide film is not grown on the surface of the substrate, either. Therefore, it is no longer necessary to etch the oxide film before performing the ion implantation for forming the source region and the drain region, and the element isolation oxide film (LOCOS film) does not become a thin film by etching the oxide film.

Example 6 of Fabrication Method

Referring to FIGS. 11A to 11D, a method for fabricating a semiconductor device according to still another example of the invention will be described.

Figure 11A:
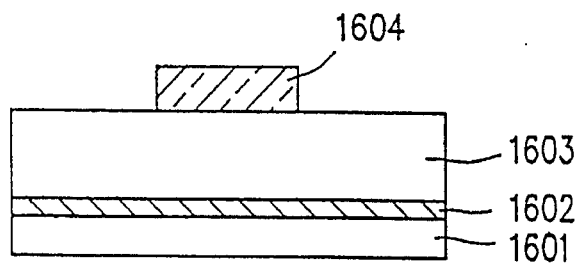
FIGS. 11A to 11D are cross-sectional views showing respective process steps of a method for fabricating a semiconductor device according to a sixth example of the invention.

First, as shown in FIG. 11A, a gate insulating film 1602 consisting of three layers of a silicon oxide film, a silicon nitride film and a silicon oxide film is formed on a P-type semiconductor substrate 1601 so that the thickness of the gate insulating film 1602 equivalent to an oxide film is about 8 nm. Then, a polycrystalline silicon film 1603 is deposited on the gate insulating film 1602 so as to be about 330 nm thick. Then, a photoresist 1604 for defining the position and the shape of a gate electrode 1605 is formed on the polycrystalline silicon film 1603.

Figure 11B:
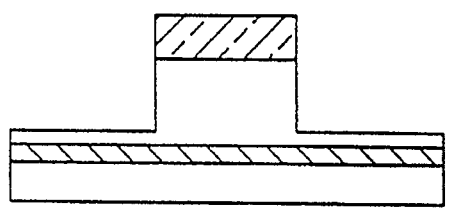

Next, as shown in FIG. 11B, the polycrystalline silicon film 1603 is etched by using the photoresist 1604 as a mask by a highly anisotropic etching process in a vertical direction so as to form a gate electrode 1605. This etching is performed until the gate insulating film 1602 is exposed. Care should be taken lest the substrate 1601 is exposed in performing the etching process.

Figure 11C:
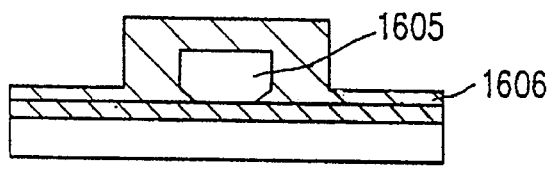

Then, as shown in FIG. 11C, the gate electrode 1605 is oxidized in an oxygen environment so that the thickness of both end portions of the gate insulating film 1602 becomes larger than the thickness of the center portion thereof. By performing this oxidation process, oxide films 1606 are formed on the upper surface and the side surfaces of the gate electrode 1605.

Figure 11D:
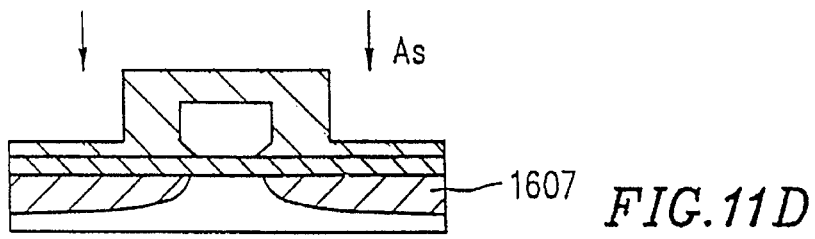

Next, as shown in FIG. 11D, arsenic (As) ions or the like are implanted as N-type impurity ions into the substrate 1601 at an implant energy of 80 KeV and at an implant dose of about $6\times10^{15}$ cm$^{-2}$, and then a heat treatment is performed at 850° C., thereby forming N-type high-concentration diffusion layers 1607 in the source region and the drain region in the P-type substrate 1601. The gate electrode 1605 is also doped with As ions simultaneously, so that an N-type poly-silicon gate electrode 1605 is formed.

According to the method of this example, since a layer including a silicon nitride film is formed on the surface of the substrate, the oxide film is not grown on the surface of the substrate. Therefore, it is no longer necessary to etch the oxide film before the ion implantation for forming the source region and the drain region, and the element isolation oxide film (LOCOS film) does not become a thin film by etching the oxide film.

Example 7 of Fabrication Method

Referring to FIGS. 12A to 12E, a method for fabricating a semiconductor device according to still another example of the invention will be described.

Figure 12A:
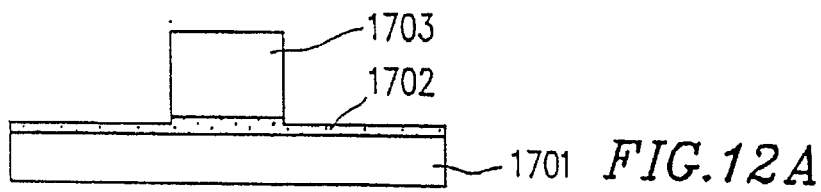
FIGS. 12A to 12E are cross-sectional views showing respective process steps of a method for fabricating a semiconductor device according to a seventh example of the invention.

First, as shown in FIG. 12A, a gate electrode 1703 constituted by an undoped first polycrystalline silicon film (thickness: about 330 nm) is formed on a P-type semiconductor substrate 1701 via a gate oxide film 1702 having a thickness of about 8 nm.

Figure 12B:
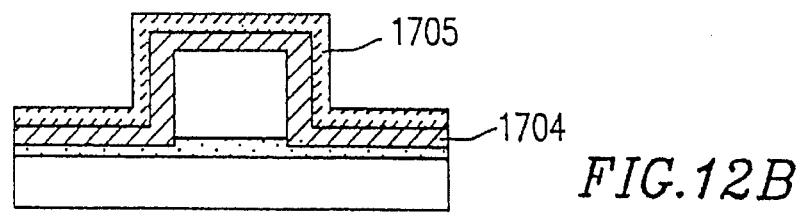

Next, as shown in FIG. 12B, a second polycrystalline silicon film 1704 doped with P-type ions and a silicon nitride film 1705 which is not likely to diffuse oxidizing agents are deposited in this order on the gate electrode 1703 and the semiconductor substrate 1701.

Figure 12C:
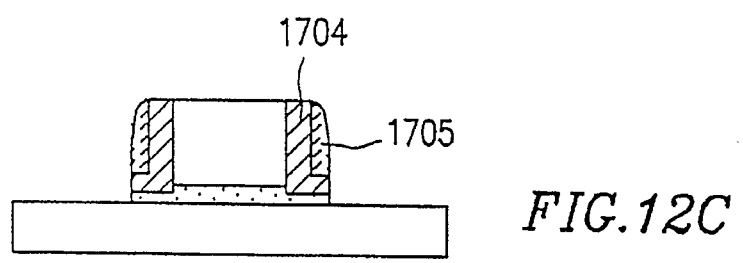

Subsequently, as shown in FIG. 12C, the silicon nitride film 1705 and the polycrystalline silicon film 1704 are etched back by a highly anisotropic etching process in a vertical direction. As a result, a part of the second polycrystalline silicon films 1704 (in an L shape) is left on each side of the gate electrode 1703. A part of the silicon nitride film 1705 is left on each side of the second polycrystalline silicon film 1704.

Figure 12D:
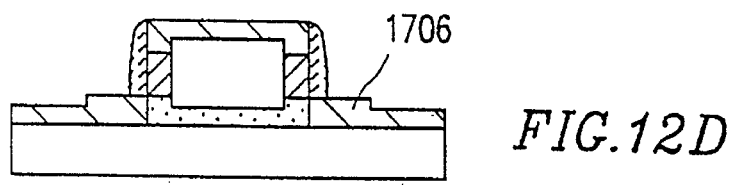

Then, the oxidization is performed in an oxygen environment. As a result, as shown in FIG. 12D, an oxide films are grown on the portions of the L-shaped second polycrystalline silicon film 1704 which are not covered with the silicon nitride films 1705. The oxide film grow by 30 nm from the interface (or the plane extending vertically with respect to the main surface of the substrate) between the silicon nitride film 1705 and the second polycrystalline silicon film 1704 outwards and inwards in a lateral direction, respectively. Consequently, the thickness of both end portions of the gate oxide film 1702 becomes larger than the thickness of the center portion thereof, and an oxide film 1706 having a thickness of about 10 nm is grown on the substrate 1701. The oxide film 1706 has a large thickness in the portions adjacent to the gate oxide film 1702, so that substantially L-shaped side wall oxide films 1706 are formed.

Figure 12E:
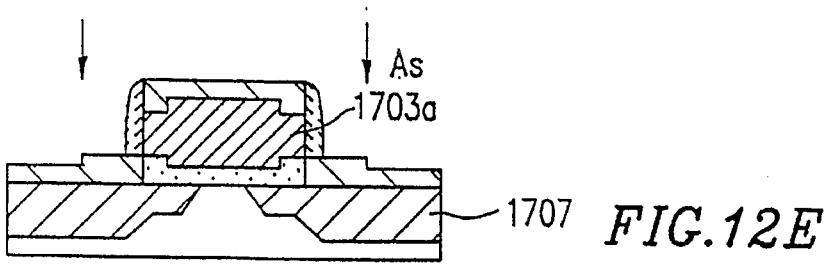

Thereafter, as shown in FIG. 12E, arsenic (As) ions or the like are implanted as N-type impurity ions into the substrate 1701 at an implant energy of 80 KeV and at an implant dose of about $6\times10^{15}$ cm$^{-2}$, and then a heat treatment is performed at 850° C., thereby forming N-type high-concentration diffusion layers 1707 in the P-type substrate 1701. The gate electrode 1703 is also doped with As ions simultaneously, so that an N-type poly-silicon gate 1703a is formed. Under the L-shaped side wall oxide films, the N-type high-concentration diffusion layers 1707 have a junction shallower than that of the other portions.

According to the method of this example, the oxidization of the sides of the gate electrode 1703 is partially prevented by the silicon nitride film 1705. In addition, the non-oxidized portions of the second polycrystalline silicon film 1704 form the gate electrode 1703a. As a result, the width of the gate electrode 1703 (or a gate length) becomes larger than the width of the gate electrode 1703 (or a gate length) shown in FIG. 12A. The width of the gate electrode 1703 (or a gate length) shown in FIG. 12A is determined by a mask layer for defining a planar layout of the gate electrode 1703. Since the gate width of the resulting gate electrode 1703a becomes larger a mask size, the electric resistance of the gate electrode 1703a can be reduced without increasing the area of the gate insulating film 1702 (or increasing the gate capacitance).

Example 8 of Fabrication Method

Referring to FIGS. 13A to 13D, a method for fabricating a semiconductor device according to still another example of the invention will be described.

Figure 13A:
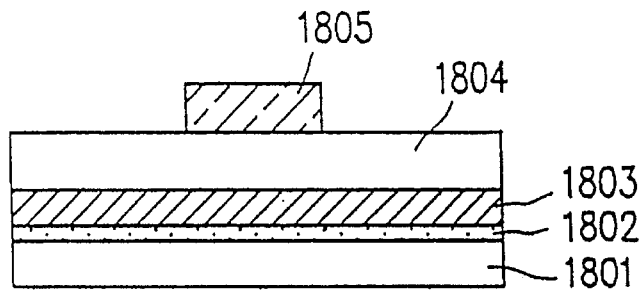
FIGS. 13A to 13D are cross-sectional views showing respective process steps of a method for fabricating a semiconductor device according to an eighth example of the invention.

First, as shown in FIG. 13A, a gate oxide film 1802 (thickness: about 8 nm), a first polycrystalline silicon film 1803 (thickness: about 50 nm) doped with P-type ions and an undoped second polycrystalline silicon film 1804 (thickness: about 280 nm) are deposited in this order on a P-type semiconductor substrate 1801. Thereafter, a photoresist 1805 for defining the shape and the position of the gate electrode 1806 is formed on the multi-layered film consisting of the gate oxide film 1802, the first polycrystalline silicon film 1803, and the second polycrystalline silicon film 1804.

Figure 13B:
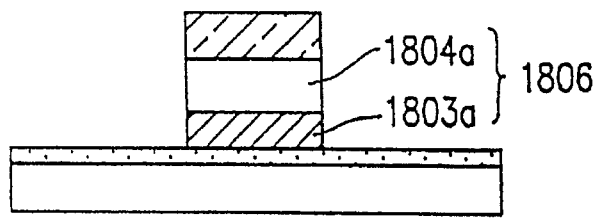

Next, as shown in FIG. 13B, the multi-layered film consisting of the gate oxide film 1802, the first polycrystalline silicon film 1803, and the second polycrystalline silicon film 1804 is etched by using the photoresist 1805 as a mask by a highly anisotropic etching process in a vertical direction until the gate oxide film 1802 is exposed. As a result, a gate electrode 1806 consisting of the first polycrystalline silicon film 1803a and the second polycrystalline silicon film 1804a is formed.

Figure 13C:
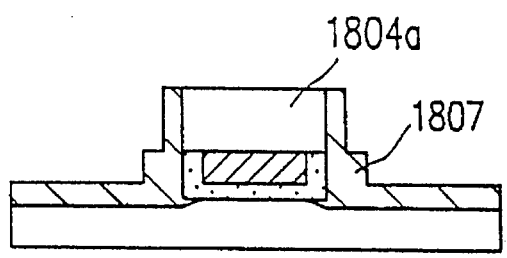

Then, by performing a thermal oxidization in an oxygen environment, as shown in FIG. 13C, oxide films 1807 are grown on the sides of the first polycrystalline silicon film 1803a of the gate electrode 1806 by 60 nm in total, i.e., 30 nm outwards and 30 nm inwards, respectively. By performing this thermal oxidization, oxide films 1807 are also grown on the sides of the second polycrystalline silicon film 1804a by 14 nm in total, i.e., 7 nm outwards and 7 nm inwards, respectively. The oxide films 1807 form the L-shaped side wall oxide films 1807, and make the thickness of both end portions of the gate oxide film 1802 larger than the thickness of the center porion thereof. An oxide film 1807 having a thickness of about 10 nm is also grown on the substrate 1801.

Figure 13D:
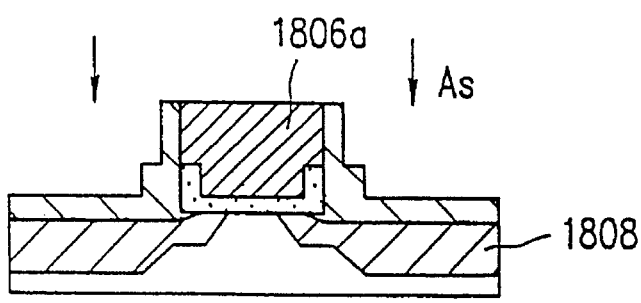

Thereafter, as shown in FIG. 13D, arsenic (As) ions or the like are implanted as N-type impurity ions into the substrate

1801 at an implant energy of 80 KeV and at an implant dose of about $6\times10^{15}$ cm$^{-2}$, and then a heat treatment is performed at 850° C., thereby forming N-type high-concentration diffusion layers 1808 in the P-type substrate 1801. The gate electrode 1806 is also doped with As ions simultaneously, so that an N-type poly-silicon gate electrode 1806a is formed. Under the L-shaped side wall oxide films, the N-type high-concentration diffusion layers 1808 have a shallow junction.

According to the method of this example, the following effects can be obtained. (1) Since thick oxide films are not grown on the entire surfaces of the side walls of the gate electrode, the increase in the effective channel length can be prevented and the driving power can be maintained. (2) The L-shaped side wall structure suppresses the short-channel effects. A semiconductor device realizing these effects can be fabricated easily in a self aligning manner by utilizing current LSI technologies.

Example 9 of Fabrication Method

Referring to FIGS. 14A to 14F, a method for fabricating a semiconductor device according to still another example of the invention will be described.

Figure 14A:
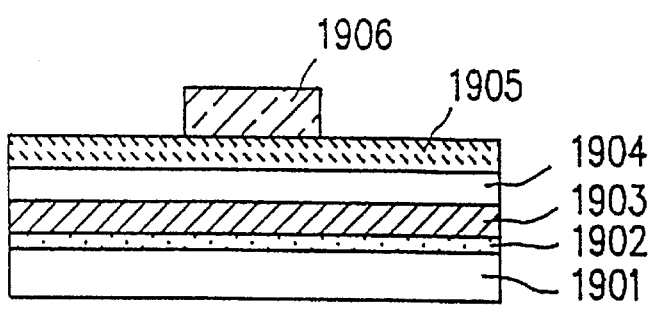
FIGS. 14A to 14F are cross-sectional views showing respective process steps of a method for fabricating a semiconductor device according to a ninth example of the invention.

First, as shown in FIG. 14A, a gate oxide film 1902 (thickness: about 8 nm), a first polycrystalline silicon film 1903 (thickness: about 50 nm) doped with P-type ions, an undoped second polycrystalline silicon film 1904 (thickness: about 280 nm), and a TiN film 1905 (thickness: about 50 nm) are deposited in this order on an N-type semiconductor substrate 1901. Thereafter, a photoresist 1906 for defining the shape and the position of a gate electrode 1907 is formed on the TiN film 1905.

Figure 14B:
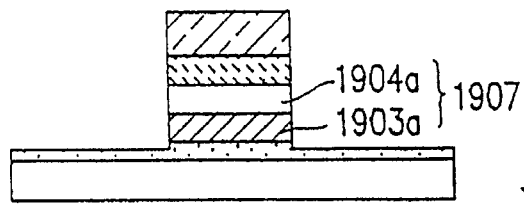

Next, as shown in FIG. 14B, a multi-layered film consisting of the gate oxide film 1902, the first polycrystalline silicon film 1903, the second polycrystalline silicon film 1904 and the TiN film 1905 is etched by using the photoresist 1906 as a mask by a highly anisotropic etching process in a vertical direction until the gate oxide film 1902 is exposed. As a result, the gate electrode 1907 including the first polycrystalline silicon film 1903a and the second polycrystalline silicon film 1904a is formed.

Figure 14C:
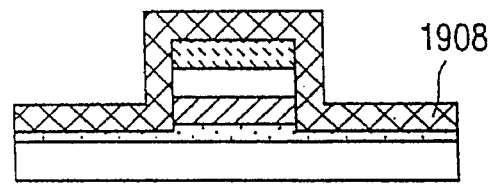

Subsequently, as shown in FIG. 14C, an HTO film (thickness: 30 nm) to be gate side walls 1908 is deposited on the gate electrode 1907 and the substrate 1901.

Figure 14D:
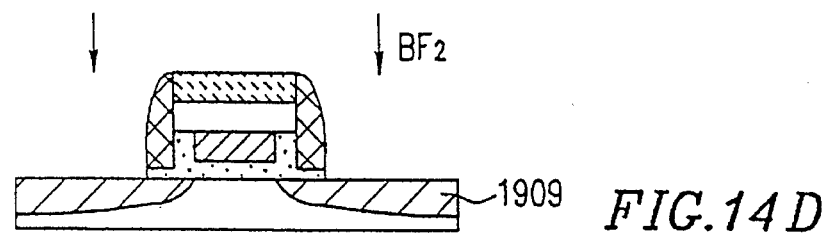

Then, as shown in FIG. 14D, the multi-layered film is etched by a highly anisotropic etching process in a vertical direction, thereby leaving the HTO film on the sides of the gate electrode 1907 and forming the gate side walls 1908.

Next, by performing a thermal oxidization in an oxygen environment, oxide films are selectively grown on the sides of the first polycrystalline silicon film 1903a of the gate electrode 1907. These oxide films grow inwards from the sides by about 30 nm. Also, oxide films grow inwards from the sides of the second polycrystalline silicon film 1904a by about 7 nm. As a result, both end portions of the gate oxide film 1902 have a larger thickness than the thickness of the center portion thereof. During this thermal oxidization process, an oxide film having a thickness of about 10 nm is grown on the substrate 1901.

Thereafter, BF$_2$ ions or the like are implanted as P-type impurity ions into the substrate 1901 at an implant energy of 40 KeV and at an implant dose of about $4\times10^{15}$ cm$^{-2}$, thereby forming P-type high-concentration diffusion layers 1909 in the source region and the drain region in the N-type substrate 1901. Then, the oxide film on the substrate 1901 is removed by a highly anisotropic etching process in a vertical direction, thereby exposing the surfaces of the P-type high-concentration diffusion layers 1909.

Figure 14E:
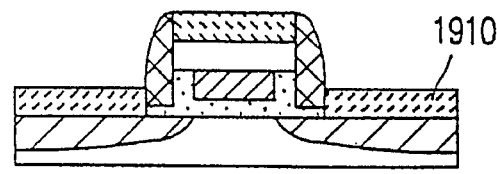

Then, as shown in FIG. 14E, the surfaces of the P-type high-concentration diffusion layers 1909 are silicified, thereby forming CoSi$_2$ 1910.

Figure 14F:
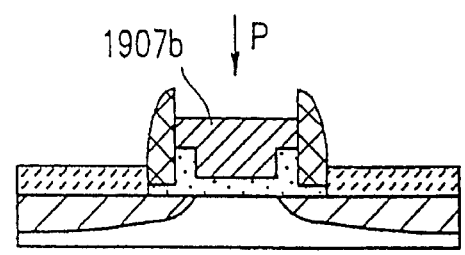

Finally, as shown in FIG. 14F, the TiN film 1905 is selectively etched. Phosphorus (P) ions or the like are implanted as N-type impurity ions into the substrate 1901 at an implant energy of 20 KeV and at an implant dose of about $6\times10^{15}$ cm$^{-2}$, and a heat treatment is performed at 850° C., thereby activating the P-type high-concentration diffusion layers 1909. The gate electrode 1907 is also doped with P ions simultaneously, so as to form an N-type poly-silicon gate electrode 1907b.

Since the silicide layer (CoSi$_2$) 1910 functions as a mask with respect to the P ions, P ions are not implanted into the P-type high-concentration diffusion layers 1909.

According to the method of this example, the kind of the dopant used for high-concentration diffusion layers can be different from the kind of the dopant used for the poly-silicon gate electrode.

Example 10 of Fabrication Method

Referring to FIGS. 15A to 15F, a method for fabricating a semiconductor device having a complementary metal-oxide-semiconductor (CMOS) structure according to still another example of the invention will be described.

Figure 15A:
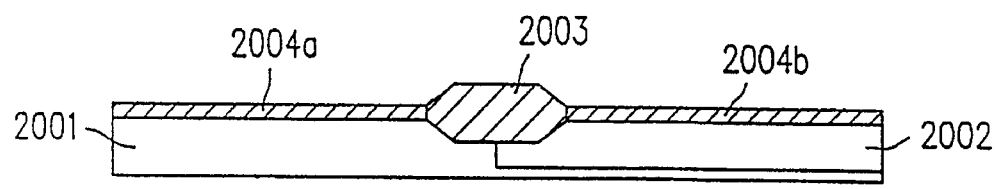
FIGS. 15A to 15F are cross-sectional views showing respective process steps of a method for fabricating a semiconductor device according to a tenth example of the invention.

First, as shown in FIG. 15A, an element isolation film (LOCOS) 2003 is formed on a main surface of a P-type semiconductor substrate 2001, and then an N-type well 2002 is formed in a predetermined island region isolated by the LOCOS 2003.

Then, by implanting phosphorus (P) ions or the like as N-type impurity ions into the substrate 2001 at an implant energy of 20 KeV and at an implant dose of about $6\times10^{11}$ cm$^{-2}$, an N-type embedded channel layer 2004a is formed in the vicinity of the surface of the P-type semiconductor substrate 2001, and an N-type threshold voltage control layer 2004b is formed in the vicinity of the surface of the N-type well 2002.

Figure 15B:
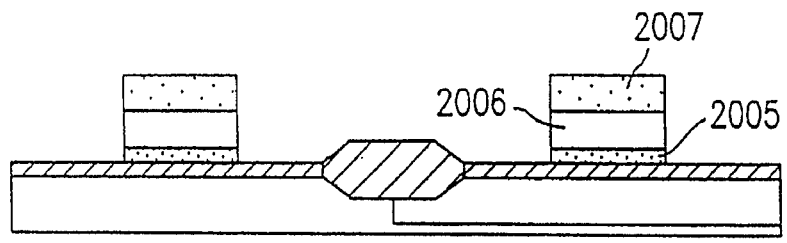

Next, as shown in FIG. 15B, a gate oxide film 2005 (thickness: about 8 nm) is formed on the P-type semiconductor substrate 2001, and a polycrystalline silicon film (thickness: about 330 nm) and an HTO film 2007 (thickness: about 50 nm) to be used as a gate electrode 2006 are deposited in this order on the gate oxide film 2005. Thereafter, a photoresist for defining the shape and the position of the gate electrode 2006 is formed on the HTO film 2007. By performing a highly anisotropic etching process in a vertical direction using this photoresist as a mask, the HTO film 2007 and the polycrystalline silicon film are etched until the gate oxide film 2005 is exposed, so as to form the gate electrode 2006.

Figure 15C:
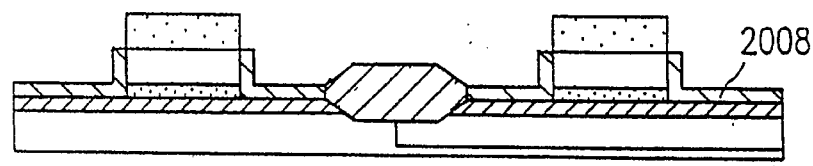

Subsequently, as shown in FIG. 15C, a protective oxidization before forming an LDD is performed. As a result, L-shaped oxide films 2008 are formed on the P-type semiconductor substrate 2001 (about 7 nm), the N-type well 2002 (about 7 nm), and the gate electrode 2006 (about 10 nm).

Figure 15D:
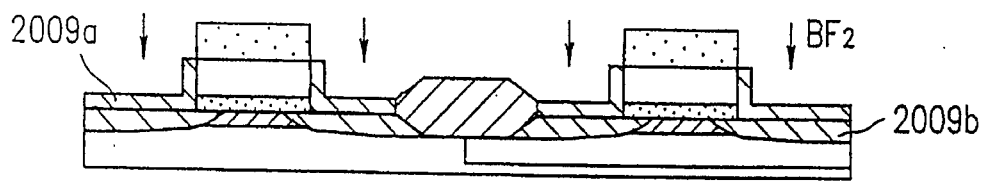

Next, as shown in FIG. 15D, by implanting BF$_2$ ions or the like as P-type impurity ions into the substrate 2001 at an implant energy of 20 KeV and at an implant dose of about $6\times10^{12}$ cm$^{-2}$, a P-type low-concentration diffusion layer 2009b is formed in a region of the N-type well 2002, and a P-type punch through stopper layer 2009a is formed on the P-type semiconductor substrate 2001.

Figure 15E:
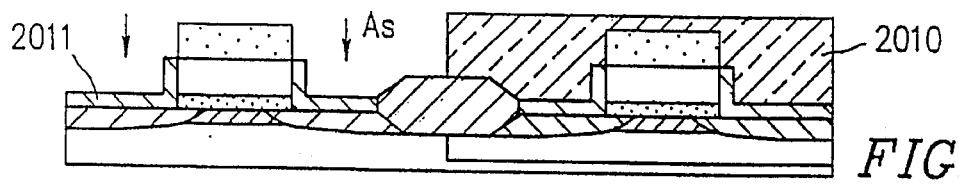

Then, as shown in FIG. 15E, by implanting arsenic (As) ions or the like as N-type impurity ions into the substrate 2001 at an implant energy of 60 KeV and at an implant dose of about $6\times10^{15}$ cm$^{-2}$ using an ion implantation mask 2010 selectively formed on the well region 2002, an N-type high-concentration diffusion layer 2011 is formed on the P-type semiconductor substrate 2001. In this ion implantation, since the HTO film 2007 is formed on the gate electrode 2006, As ions are not implanted into the gate electrode 2006.

Figure 15F:
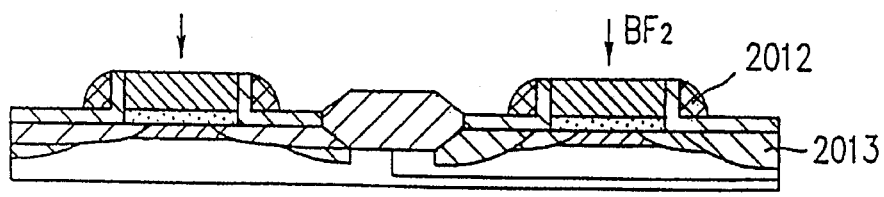

Next, as shown in FIG. 15F, the HTO film 2007 is selectively etched. Then, an HTO film 2007 (thickness: about 30 nm) to be gate side walls 2012 is deposited on the gate electrode 2006 and the substrate 2001, and etched by a highly anisotropic etching in a vertical direction, so as to leave the HTO film 2007 on the sides of the gate electrode 2006 and form the gate side walls 2012. Further, by implanting BF$_2$ ions or the like as P-type impurity ions into the substrate 2001 at an implant energy of 40 KeV and at the implant dose of about $3\times10^{15}$ cm$^{-2}$ and by performing a heat treatment at 850° C., a P-type high-concentration diffusion layer 2013 is formed in the N-type well 2002, and the gate electrode 2006 is doped with BF$_2$ ions so as to form a P-type poly-silicon gate electrode 2006. In this ion implantation, As ions are implanted into the P-type semiconductor substrate 2001 at a high implant energy and at a high implant dose, the effects of BF$_2$ ions are offset.

According to the method of this example, a complementary type semiconductor device having a P-type poly-silicon gate can be fabricated easily.

Example 11 of Fabrication Method

Referring to FIGS. 16A to 16F, a method for fabricating a semiconductor device according to still another example of the invention will be described.

Figure 16A:
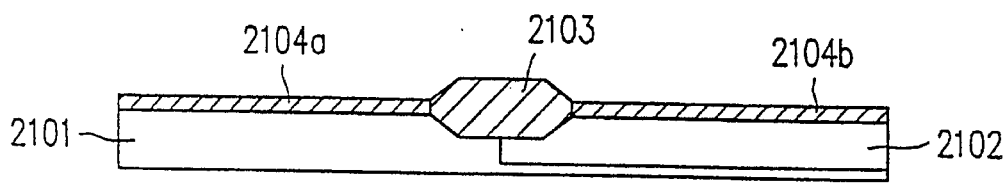
FIGS. 16A to 16F are cross-sectional views showing respective process steps of a method for fabricating a semiconductor device according to an eleventh example of the invention.

First, as shown in FIG. 16A, an LOCOS 2103 is formed on a main surface of a P-type semiconductor substrate 2101, and then an N-type well 2102 is formed in a predetermined island region isolated by the LOCOS 2103.

Then, by implanting phosphorus (P) ions or the like as N-type impurity ions into the substrate 2101 at an implant energy of 20 KeV and at an implant dose of about $6\times10^{11}$ cm$^{-2}$, an N-type embedded channel layer 2104a is formed in the vicinity of the surface of the P-type semiconductor substrate 2101, and an N-type threshold voltage control layer 2104b is formed in the vicinity of the surface of the N-type well 2102.

Figure 16B:
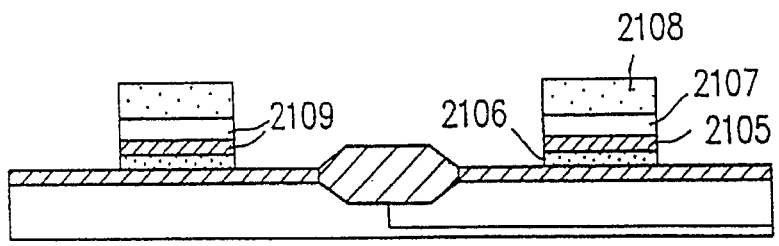

Next, as shown in FIG. 16B, a gate oxide film 2105 (thickness: about 8 nm) is formed on the P-type semiconductor substrate 2101, and a first polycrystalline silicon film 2106 (thickness: about 50 nm) doped with boron (B) ions, an undoped second polycrystalline silicon film 2107 (thickness: about 280 nm) and an HTO film 2108 (thickness: about 50 nm) are deposited in this order on the gate oxide film 2105. Thereafter, a photoresist for defining the shape and the position of the gate electrode 2109 is formed on a multi-layered film formed by the HTO film 2108. By performing a highly anisotropic etching process in a vertical direction using this photoresist as a mask, the first polycrystalline silicon film 2106, the second polycrystalline silicon film 2107 and the HTO film 2108 are etched until the gate oxide film 2105 is exposed, so as to form the gate electrode 2109.

Figure 16C:
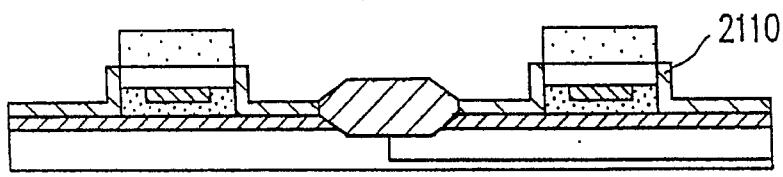

Then, as shown in FIG. 16C, by performing a thermal oxidization in an oxygen environment, oxide films 2110 are grown on the sides of the first polycrystalline silicon film 2106 of the gate electrode 2109 by about 60 nm in total, i.e., 30 nm outwards and 30 nm inwards from the ends of the gate, respectively. By performing this thermal oxidization, oxide films 2110 are also grown on the sides of the second polycrystalline silicon film 2107 by about 14 nm in total, i.e., 7 nm outwards and 7 nm inwards, respectively. The oxide films 2110 thus grown constitute the L-shaped side wall oxide films 2110, and make the thickness of both ends of the gate oxide film 2105 larger than the thickness of the center porion thereof. An oxide film 2110 having a thickness of about 10 nm is also grown on the substrate 2101.

Figure 16D:
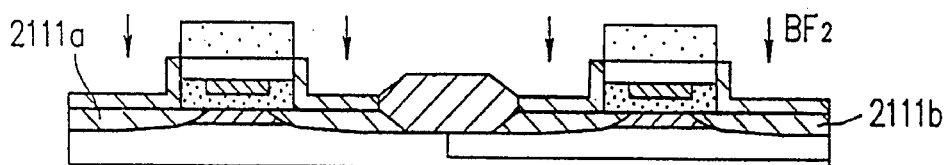

Next, as shown in FIG. 16D, by implanting BF$_2$ ions or the like as P-type impurity ions into the substrate 2101 at an implant energy of 20 KeV and at an implant dose of about $6\times10^{12}$ cm$^{-2}$, a P-type low-concentration diffusion layer 2111b is formed in a region of the N-type well 2102, and a P-type punch through stopper layer 2111a is formed on the P-type semiconductor substrate 2101.

Figure 16E:
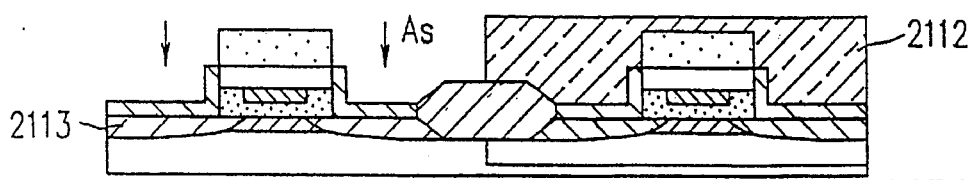

Then, as shown in FIG. 16E, by implanting arsenic (As) ions or the like as N-type impurity ions into the substrate 2101 at an implant energy of 60 KeV and at an implant dose of about $6\times10^{15}$ cm$^{-2}$ using an ion Referring to FIGS. 17A to 17G, a method for fabricating a semiconductor device according to still another example of the invention will be described.

Figure 17A:
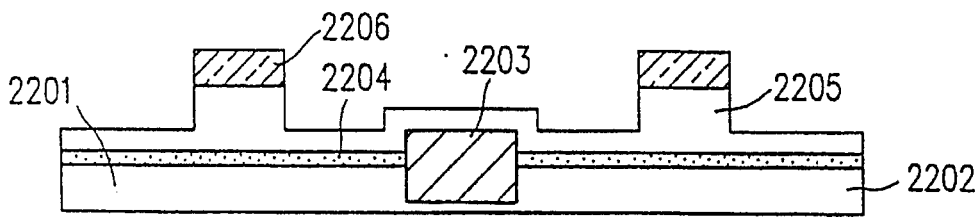
FIGS. 17A to 17G are cross-sectional views showing respective process steps of a method for fabricating a semiconductor device according to a twelfth example of the invention.

First, as shown in FIG. 17A, an element isolation film (LOCOS) 2203 is formed on a main surface of a P-type semiconductor substrate 2201, and then an N-type well 2202 is formed in a predetermined island region isolated by the LOCOS 2203. Next, a gate oxide film 2204 (thickness: about 8 nm) is formed on the P-type semiconductor substrate 2201, and an undoped polycrystalline silicon film 2205 (thickness: about 330 nm) is deposited on the gate oxide film 2204. Thereafter, by using a photoresist 2206, a part of the undoped polycrystalline silicon film 2205 is lightly etched.

Figure 17B:
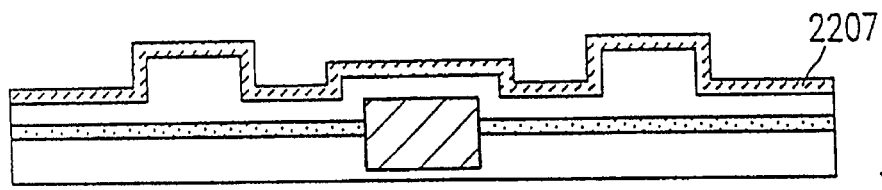

Then, as shown in FIG. 17B, a silicon nitride film 2207 is deposited on the entire upper surface of the semiconductor substrate 2201.

Figure 17C:
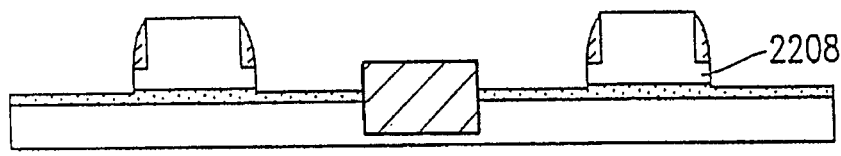

Next, as shown in FIG. 17C, by etching back the silicon nitride film 2207 and the undoped polycrystalline silicon film 2205, a gate electrode 2208 whose upper side surfaces are covered with the silicon nitride films 2207 is formed.

Figure 17D:
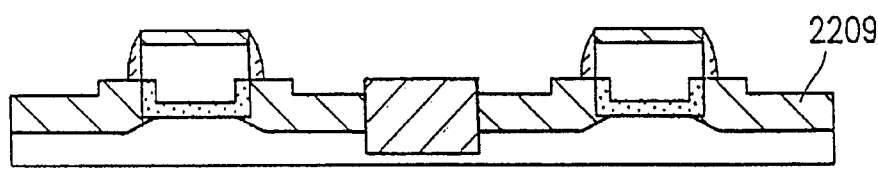

Subsequently, as shown in FIG. 17D, L-shaped side wall oxide films 2209 are formed on the sides of the gate electrode 2208 by a thermal oxidization.

Figure 17E:
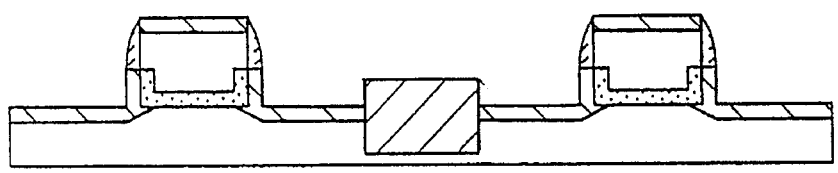

Next, as shown in FIG. 17E, the oxide film grown on the substrate 2201 is lightly etched. implantation mask 2112 selectively formed on the well region 2102, a N-type high-concentration diffusion layer 2113 is formed on the P-type semiconductor substrate 2101. In this ion implantation, since the HTO film 2108 is formed on the gate electrode 2109, As ions are not implanted into the gate electrode 2109.

Figure 16F:
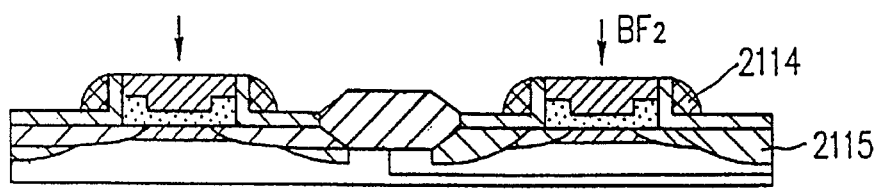

Next, as shown in FIG. 16F, the HTO film 2108 is selectively etched. Then, an HTO film (thickness: about 30 nm) to be gate side walls 2114 is deposited on the gate electrode 2109 and the substrate 2101, and etched by a highly anisotropic etching in a vertical direction, so as to leave the HTO films on the sides of the gate electrode 2109 and form the gate side walls 2114. Further, by implanting BF$_2$ ions or the like as P-type impurity ions into the substrate 2101 at an implant energy of 40 KeV and at an implant dose of about $3\times10^{15}$ cm$^{-2}$ and by performing a heat treatment at 850° C., a P-type high-concentration diffusion layer 2115 is formed in the N-type well 2102, and the gate electrode 2109 is doped with $BF_2$ ions so as to form a P-type poly-silicon gate electrode 2109. In this ion implantation, since As ions are implanted into the P-type semiconductor substrate 2101 at a high implant energy and at a high implant dose, the effects of $BF_2$ ions are offset.

According to the method of this example, a semiconductor device having a P-type poly-silicon gate can be fabricated easily.

Example 12 of Fabrication Method

Figure 17F:
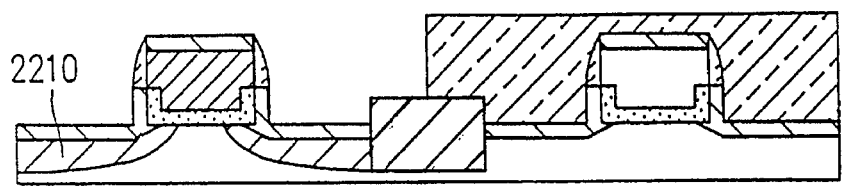

Then, as shown in FIG. 17F, by implanting arsenic (As) ions or the like as N-type impurity ions into the substrate 2201 at an implant energy of 40 KeV and at an implant dose of about $6 \times 10^{15}$ $cm^{-2}$ using an ion implantation mask selectively formed on the well region 2202, an N-type high-concentration diffusion layer 2210 is formed on the P-type semiconductor substrate 2201.

Figure 17G:
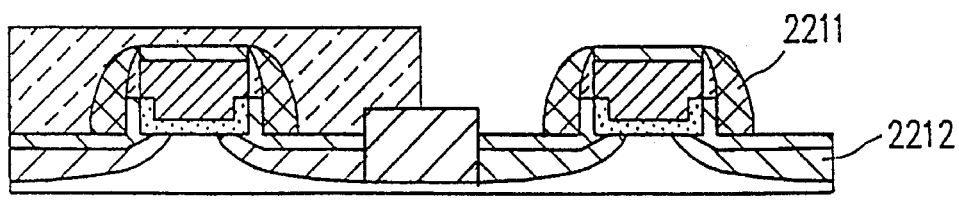

Subsequently, as shown in FIG. 17G, gate side walls 221 are formed, and then by implanting $BF_2$ ions or the like as P-type impurity ions into the substrate 2201 at an implant energy of 40 KeV and at an implant dose of about $4 \times 10^{15}$ $cm^{-2}$ using an ion implantation mask selectively formed on the P-type semiconductor substrate 2201 and by performing a heat treatment at 850° C., a P-type high-concentration diffusion layer 2212 is formed in a region of the N-type well 2202, and the gate electrode 2208 is doped with $BF_2$ ions so as to form a P-type poly-silicon gate electrode. By adjusting the thickness of the gate side walls 2211, the effective channel length of the Nch MOSFET (or the distance between the N-type high-concentration source/drain diffusion layers 2210) can be substantially as long as the effective channel length of the Pch MOSFET (or the distance between the P-type high-concentration source/drain diffusion layers 2212).

The characteristics of a device and a CMOS circuit of the semiconductor device of the invention thus fabricated and those of a conventional semiconductor device (or a semiconductor device fabricated according to a conventional method) are compared by using a process/device/circuit simulation system. In this case, the gate length is set to be 0.4 µm.

Both the oxide films grown on the sides of the gate electrode 2208 have the same thickness from each side surface of the gate electrode 2208. Therefore, according to the invention, the width of the gate side walls 2211 is set as follows: when the thickness of the re-oxidized film is 0 nm, the width is set to be 60 nm; when the thickness of the re-oxidized film is 20 nm, the width is set to be 50 nm; when the thickness of the re-oxidized film is 40 nm, the width is set to be 40 nm; and when the thickness of the re-oxidized film is 30 nm, the width is set to be 30 nm.

Figure 18A:
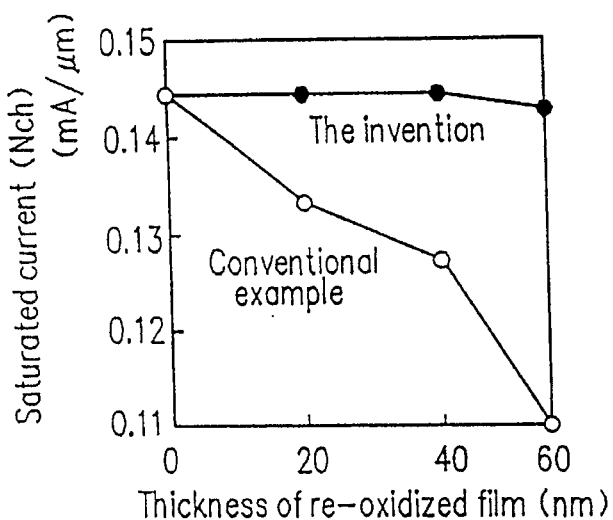
FIGS. 18A and 18B are graphs showing in comparison the saturated currents of the invention and those of a conventional example.
Figure 18B:
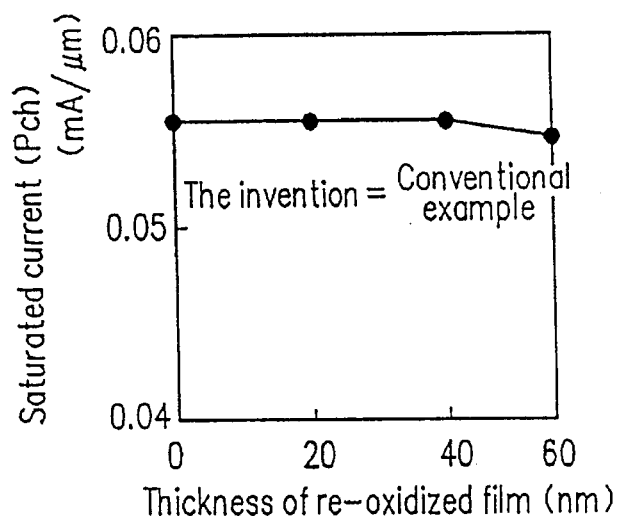

FIG. 18A is a graph showing in comparison the saturated currents of the invention and those of a conventional example in an Nch MOSFET, while FIG. 18B is a graph showing in comparison the saturated currents of the invention and those of a conventional example in a Pch MOSFET. The abscissas indicate the thickness of the re-oxidized film and the ordinates indicate a saturated current value corresponding to a gate width of 1 µm.

As shown in FIG. 18A, in the Nch MOSFET of the invention, the saturated current value does not depend upon the thickness of the re-oxidized film, while in the Nch MOSFET of a conventional example, the larger the thickness of the re-oxidized film becomes, the smaller the saturated current value becomes. The reason is as follows. In a conventional example, the side wall oxide films formed on the side walls of the gate electrode shift outwards the implantation position into the source region and the drain region, and the effective channel length is increased. On the other hand, according to the invention, the side wall oxide films are not formed on the side walls of the gate electrode.

Figure 19A:
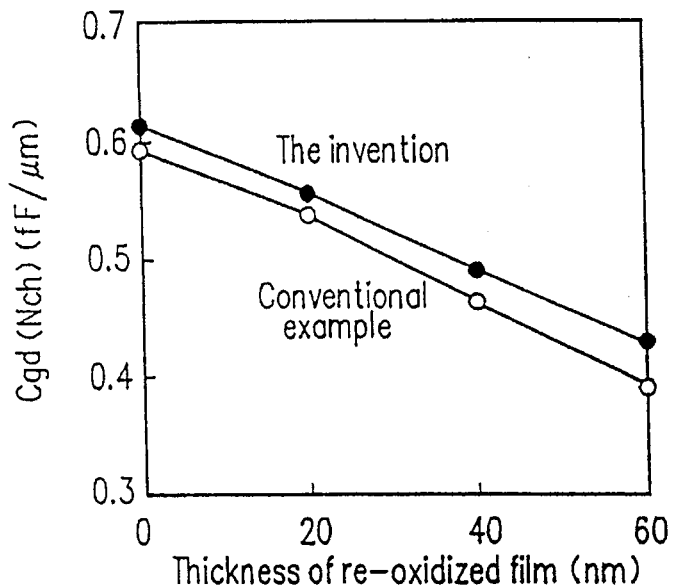
FIGS. 19A and 19B are graphs showing in comparison a gate-drain capacitance of the invention and that of a conventional example.
Figure 19B:
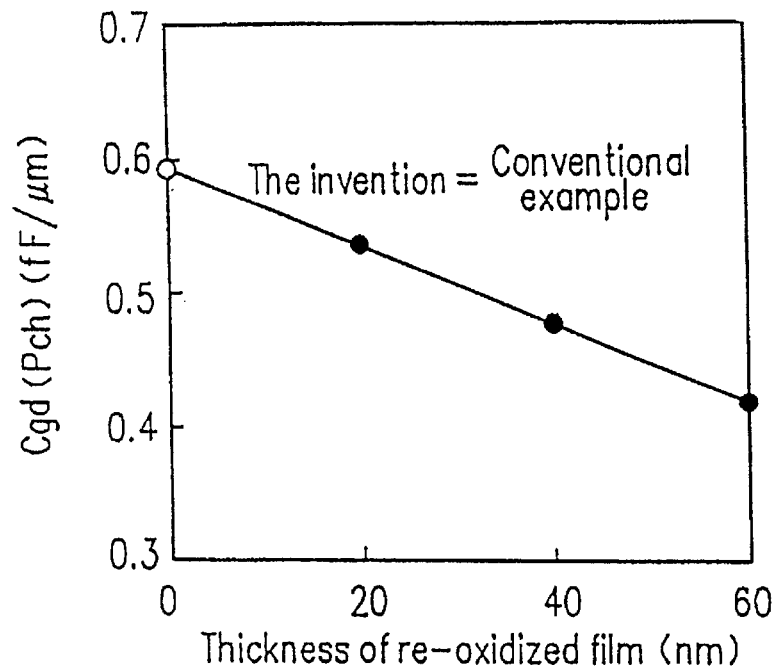

FIG. 19A is a graph showing in comparison a gate-drain capacitance of the invention and that of a conventional example in an Nch MOSFET, while FIG. 19B is a graph showing in comparison a gate-drain capacitance of the invention and that of a conventional example in a Pch MOSFET. The abscissas indicate the thickness of the re-oxidized film and the ordinates indicate a gate-drain capacitance corresponding to a gate width of 1 µm. The gate-drain capacitance is an average of the value when the drain voltage is 0.0 V and the gate voltage is 1.5 V, and the value when the drain voltage is 1.5 V and the gate voltage is 0.0 V. As shown in FIGS. 19A and 19B, the gate-drain capacitance decreases in proportion to the thickness of the re-oxidized film in both the invention and the conventional example.

Figure 20A:
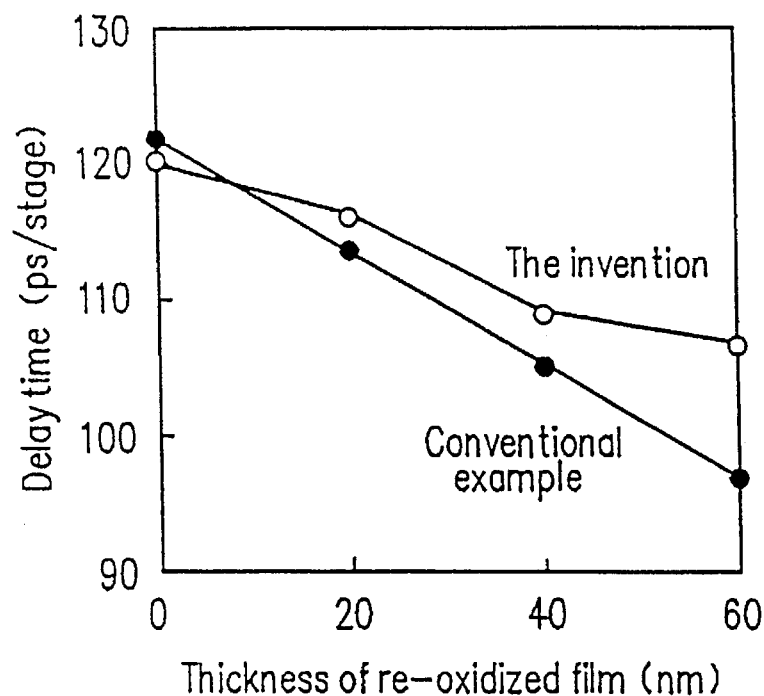
FIGS. 20A and 20B are graphs showing in comparison the delay time of the invention and that of a conventional example.
Figure 20B:
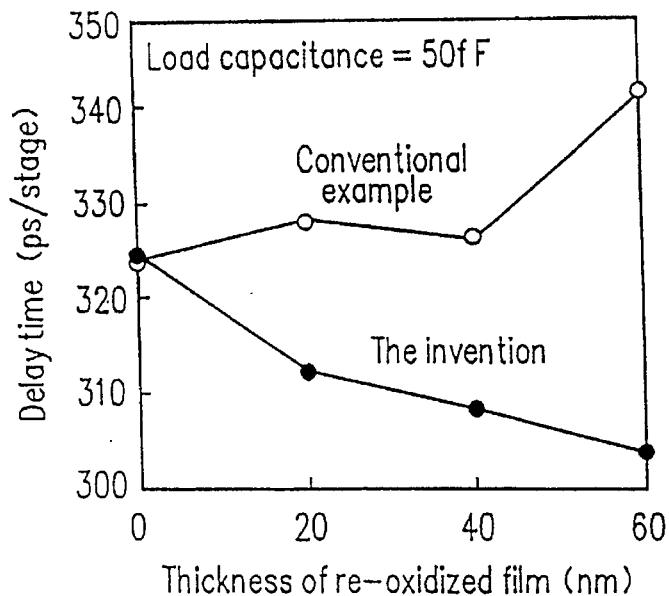

FIGS. 20A and 20B are graphs showing in comparison the delay time of the invention and that of a conventional example. The abscissas indicate the thickness of the re-oxidized film and the ordinates indicate the delay time in a ring oscillator with fan-in and fan-out of one. In FIG. 20A, the line load capacitance is assumed to be small, while in FIG. 20B, the line load capacitance is assumed to be large. As shown in FIG. 20A, the delay time decreases in proportion to the thickness of the re-oxidized film in both the invention and the conventional example. However, in the conventional example, when the thickness of the re-oxidized film is 60 nm, the delay time is improved by only 10%, while in the invention, the delay time is improved by as much as 20%. As shown in FIG. 20B, the increase in the thickness of the re-oxidized film reduces the delay time when the line load capacitance is large, according to the invention. However, in a conventional example, the increase in the thickness of the re-oxidized film increases the delay time, to the contrary.

Example 13 of Fabrication Method

Referring to FIGS. 21A to 21F, a method for fabricating a semiconductor device according to still another example of the invention will be described.

Figure 21A:
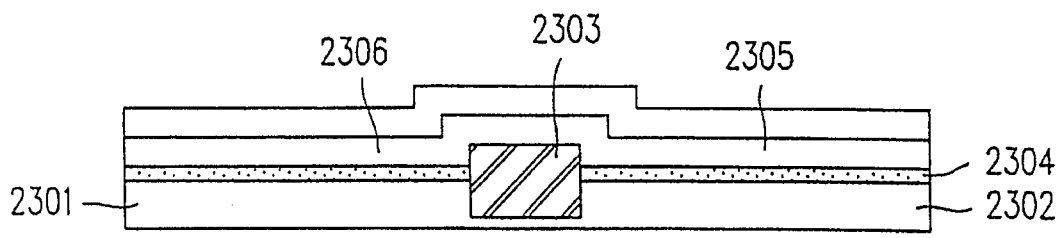
FIGS. 21A to 21F are cross-sectional views showing respective process steps of a method for fabricating a semiconductor device according to a thirteenth example of the invention.

First, as shown in FIG. 21A, an element isolation film (LOCOS) 2303 is formed on a main surface of a P-type semiconductor substrate 2301, and then an N-type well 2302 is formed in a predetermined island region isolated by the LOCOS 2303. Next, a gate oxide film 2304 (thickness: about 7 nm) is formed on the P-type semiconductor substrate 2301, and an undoped polycrystalline silicon film 2305 (thickness: about 50 nm) and an amorphous silicon film 2306 (thickness: about 280 nm) are deposited on the gate oxide film 2304.

Figure 21B:
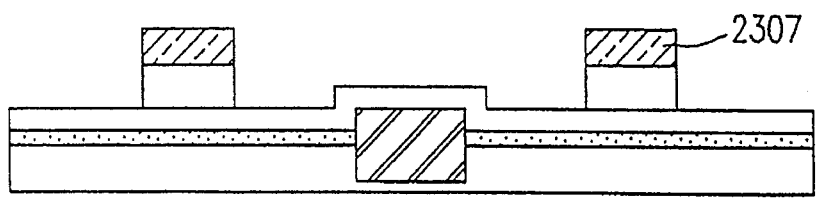

Then, as shown in FIG. 21B, a part of the amorphous silicon film 2306 and a part of the undoped polycrystalline silicon film 2305 are removed by using a photoresist 2307.

Figure 21C:
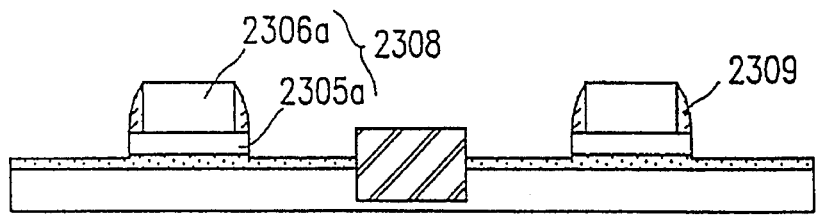

Next, after removing the photoresist 2307, a silicon nitride film 2309 (thickness: about 10 nm) is deposited as a film which is unlikely to diffuse oxidizing agents. Thereafter, a multi-layered film consisting of a gate oxide film 2304, the polycrystalline silicon film 2305 and the silicon nitride film 2309 is removed by a highly anisotropic etching process in a vertical direction. This etching process is performed so that the silicon nitride films 2309 are left on the sides of a gate electrode 2308 and that the gate oxide film 2304 is exposed. As a result, as shown in FIG. 21C, the gate electrode 2308 including the polycrystalline silicon film 2305a and the amorphous silicon film 2306a is formed.

Figure 21D:
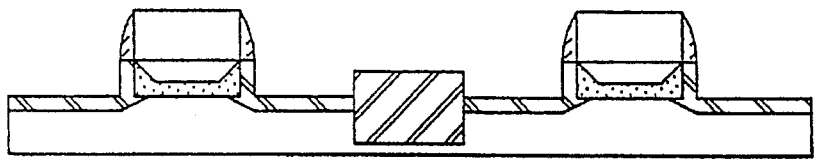

Subsequently, as shown in FIG. 21D, oxide films are grown on the sides of the gate electrode 2308 where the silicon nitride films 2309 are not left, by about 60 nm in total, i.e., in an outward direction (30 nm) and in an inward direction (30 nm) from both ends of the gate, and at the same time, the gate oxide film 2304 is oxidized in an oxygen environment so that both end portions of the gate oxide film 2304 have a thickness larger than the thickness of the center portion thereof.

Figure 21E:
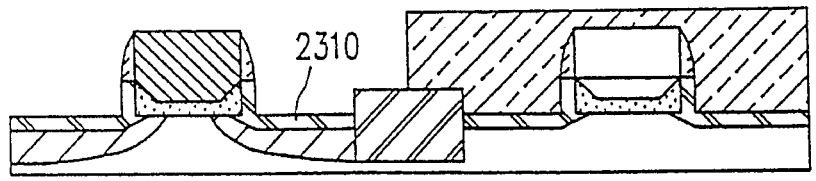

Then, as shown in FIG. 21E, by implanting arsenic (As) ions or the like as N-type impurity ions into the substrate 2301 at an implant energy of 40 KeV and at an implant dose of about $6 \times 10^{15}$ cm$^{-2}$ using an ion implantation mask selectively formed on the well region 2302, an N-type high-concentration diffusion layer 2310 is formed on the P-type semiconductor substrate 2301.

Figure 21F:
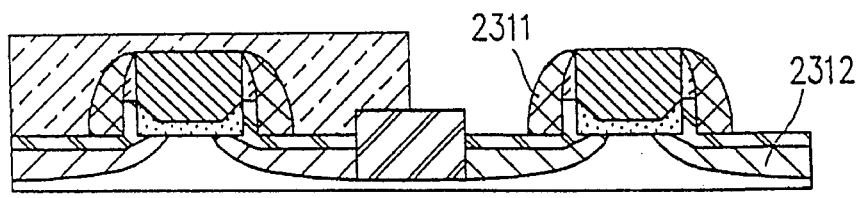

Subsequently, as shown in FIG. 21F, gate side walls 2311 are formed, and then by implanting $BF_2$ ions or the like as P-type impurity ions into the substrate 2301 at an implant energy of 30 KeV and at an implant dose of about $4 \times 10^{15}$ cm$^{-2}$ using an ion implantation mask selectively formed on the P-type semiconductor substrate 2301 and by performing a heat treatment at 850° C., a P-type high-concentration diffusion layer 2312 is formed in a region of the N-type well 2302, and the gate electrode 2308 is doped with $BF_2$ ions so as to form a P-type poly-silicon gate electrode. By adjusting the thickness of the gate side walls 2311, the effective channel length of the Nch MOSFET (or the distance between the N-type high-concentration source/drain diffusion layers 2310) can be substantially as long as the effective channel length of the Pch MOSFET (or the distance between the P-type high-concentration source/drain diffusion layers 2312).

Both the oxide films grown on the sides of the gate electrode 2308 have the same thickness from each side surface of the gate electrode 2308. Therefore, according to the invention, the width of the gate side walls 2311 is set as follows: when the thickness of the re-oxidized film is 0 nm, the width is set to be 60 nm; when the thickness of the re-oxidized film is 20 nm, the width is set to be 50 nm; when the thickness of the re-oxidized film is 40 nm, the width is set to be 40 nm; and when the thickness of the re-oxidized film is 30 nm, the width is set to be 30 nm.

The characteristics of a device and a CMOS circuit of the semiconductor device fabricated according to the method of this example of the invention and those of a conventional semiconductor device (or a semiconductor device fabricated by a conventional method, i.e., almost the same method as the method of this example but not including the process step as shown in FIG. 21C) are compared by way of actual fabrication.

Figure 22:
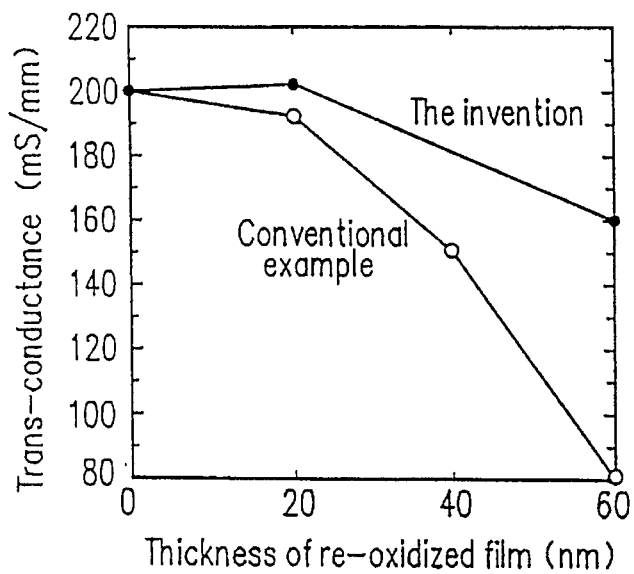
FIG. 22 is a graph showing in comparison a transconductance of the invention and that of a conventional example.

FIG. 22 is a graph showing in comparison an actually measured trans-conductance of an Nch MOSFET of the invention and that of a conventional example. The abscissas indicate the thickness of the re-oxidized film and the ordinates indicate a trans-conductance per gate width of 1 mm when the drain voltage and the gate voltage are 1.5 V. As shown in FIG. 22, in the Nch MOSFET of the invention, the trans-conductance value does not depend upon the thickness of the re-oxidized film, while in the Nch MOSFET of a conventional example, the larger the thickness of the re-oxidized film becomes, the smaller the trans-conductance value becomes. The reason is as follows. In a conventional example, since the side wall oxide films formed on the side walls of the gate electrode shift outwards the implantation position into the source region and the drain region, the effective channel length is increased; the thickness of the gate oxide film in the junction portion between the source and the drain becomes very large and the parasitic resistance increases. On the other hand, according to the invention, the side wall oxide films are not formed on the side walls of the gate electrode.

Figure 23:
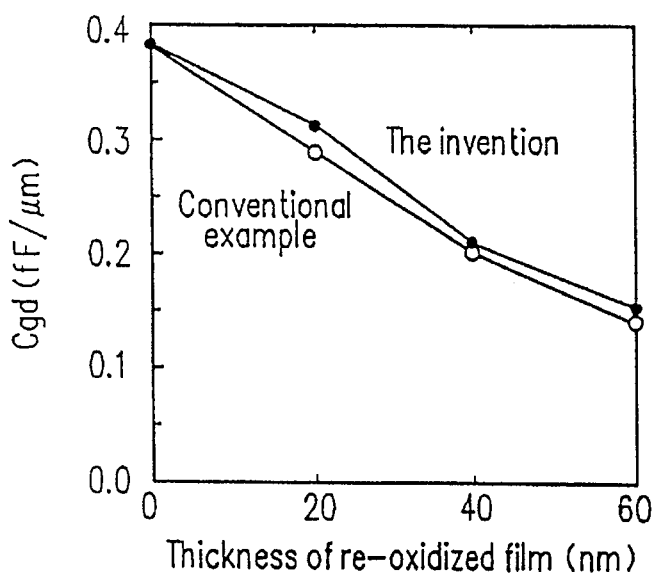
FIG. 23 is a graph showing in comparison a gate-drain capacitance of the invention and that of a conventional example.

FIG. 23 is a graph showing in comparison a gate-drain capacitance of an Nch MOSFET of the invention and that of a conventional example. The abscissas indicate the thickness of the re-oxidized film and the ordinates indicate a gate-drain capacitance per gate width of 1 μm when the drain voltage and the gate voltage are 0.0 V. As shown in FIG. 23, the gate-drain capacitance decreases in proportion to the thickness of the re-oxidized film in both the invention and the conventional example.

Figure 24A:
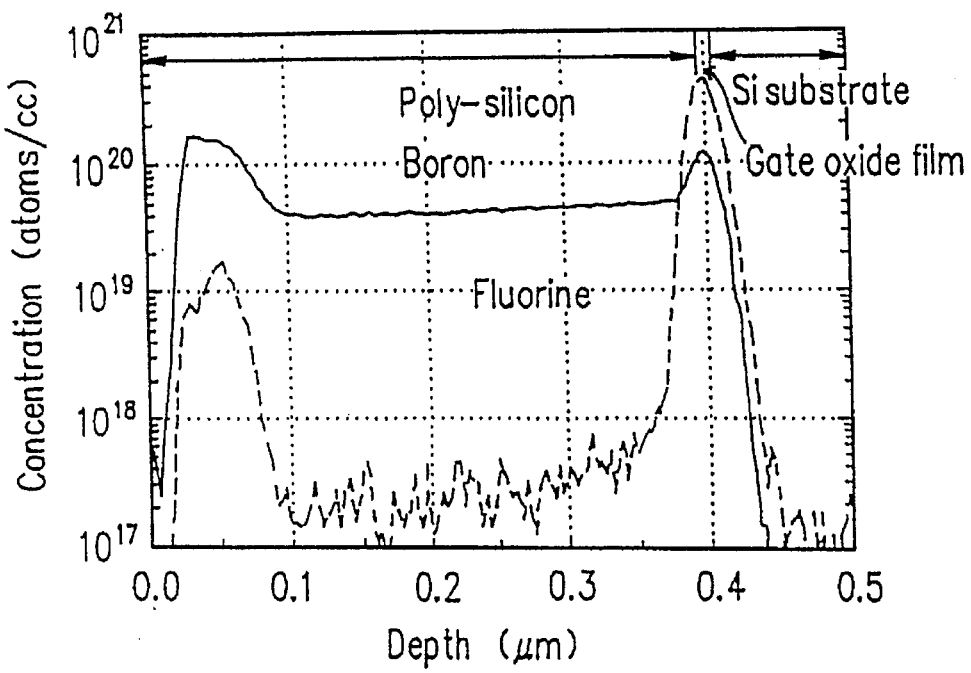
FIG. 24A is a graph showing concentration profiles of boron and fluorine according to a conventional example.
Figure 24B:
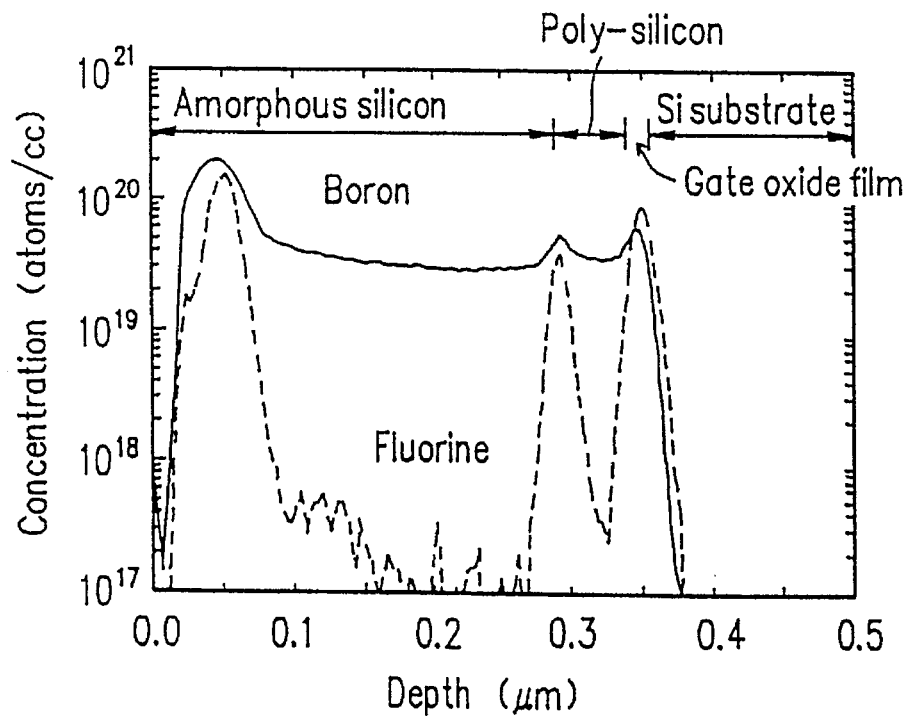
FIG. 24B is a graph showing concentration profiles of boron and fluorine according to the invention.

FIGS. 24A and 24B are graphs showing in comparison SIMS concentration profiles of boron and fluorine according to a conventional example and according to the invention. The abscissas indicate the depth (μm) of the Pch MOSFET in the gate depth direction on the cross section of the wafer, and the ordinates indicate the concentrations of boron and fluorine. As shown in FIGS. 24A and 24B, much boron diffuses into the Si substrate in a conventional example. However, according to the invention, the existence of a native oxide film in the interface between amorphous silicon and poly-silicon can suppress the diffusion of fluorine which adversely promotes the diffusion of boron into an Si substrate, so that almost no boron diffuses into the Si substrate.

Figure 25:
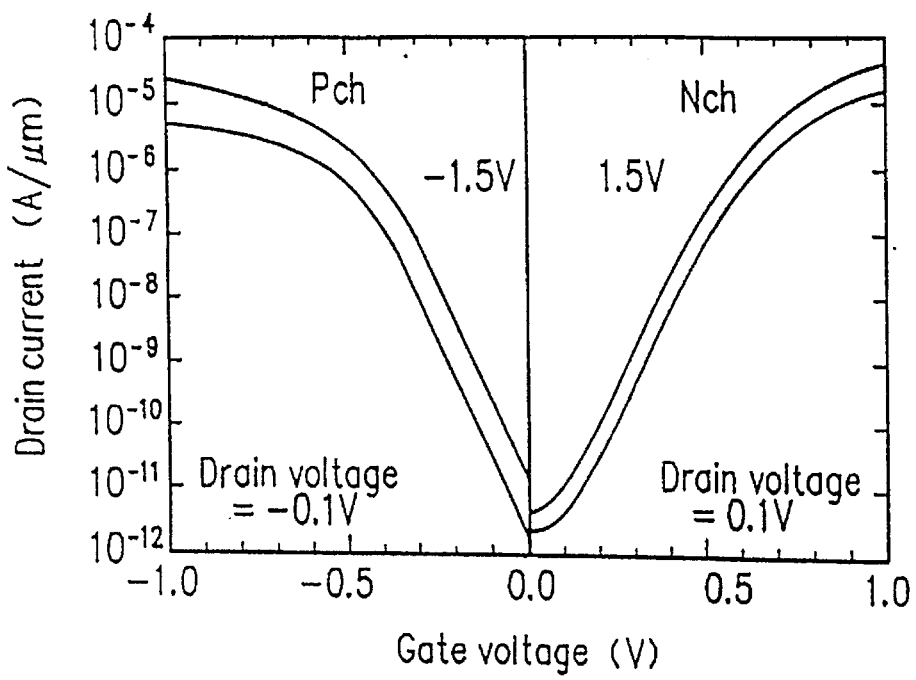
FIG. 25 is a graph showing sub-threshold characteristics of the invention.

FIG. 25 is a graph showing actually measured sub-threshold characteristics of the invention. The abscissas indicate the gate voltage, and the ordinates indicate the drain current per gate width of 1 μm. In the Nch MOSFET, the drain voltage is set to be 0.1 V and 1.5 V, while in the Pch MOSFET, the drain voltage is set to be −0.1 V and −1.5 V, respectively. As shown in FIG. 25, according to the invention, excellent sub-threshold characteristics can be obtained in both the Nch MOSFET and Pch MOSFET. The sub-threshold coefficient are very small, i.e., 78 mV/dec in the Pch MOSFET and 83 mV/dec in the Nch MOSFET. The threshold voltage can be set to be low, i.e., 0.45 V in the Nch MOSFET and 0.30 V in Pch MOSFET. Since the actually measured threshold voltage is substantially equal to the simulated value, and the shift of the flat band is not measured by C-V measurement, it is possible to conclude that almost no boron diffused.

Figure 26:
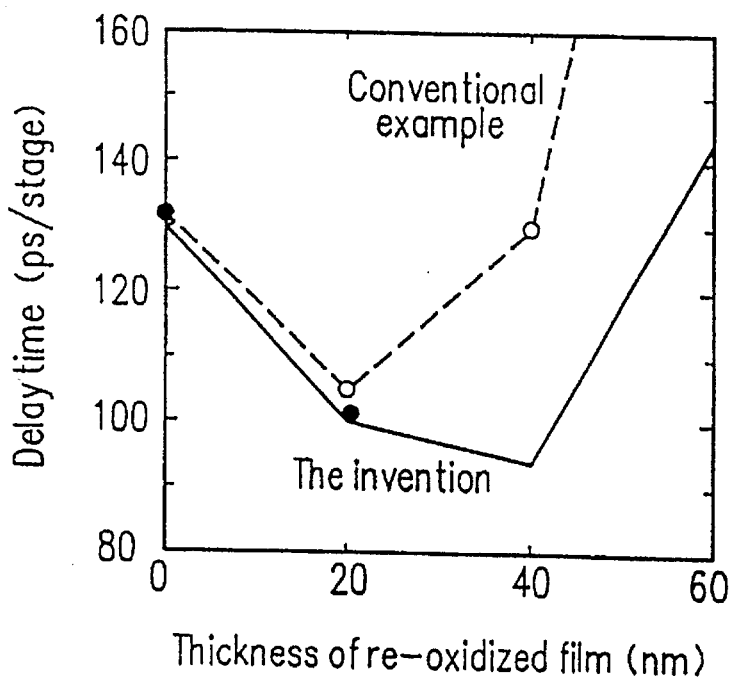
FIG. 26 is a graph showing in comparison the delay time of the invention and that of a conventional example.

FIG. 26 is a graph showing in comparison actually measured delay time of the invention and that of a conventional example. The abscissas indicate the thickness of the re-oxidized film and the ordinates indicate delay time in a ring oscillator with fan-in and fan-out of one. As shown in FIG. 26, when the thickness of the re-oxidized film is 20 nm, the minimum value of the delay time becomes 106 ps/stage in a conventional example. On the other hand, according to the invention, when the thickness of the re-oxidized film is 40 nm, the minimum value of the delay time becomes 93 ps/stage.

A semiconductor device of the invention makes possible the following advantages.

(1) Since the junction depth D1 of the high-concentration source/drain diffusion layers located under the L-shaped gate side wall oxide films is shallower than the junction depth D2 of the high-concentration source/drain diffusion layers not located under the L-shaped gate side wall oxide films, it is possible to effectively suppress the expansion of the potential from the source/drain diffusion layers towards the channel direction. Consequently, the reduction in the threshold voltage characteristic of a fine MOSFET can be suppressed effectively.

(2) Since the high-concentration source/drain diffusion layers diffuse under the gate oxide film, whose both end portions have a large thickness, it is possible to reduce the gate-drain capacitance and the gate-source capacitance without reducing the drain current.

(3) The gate electrode has a two-layered structure consisting of a polycrystalline silicon film and an amorphous silicon film, so that the diffusion of boron (B) from P-type poly-silicon to a bulk, which adversely occurs in a conventional dual-gate technology, can be prevented effectively.

(4) By employing a T-shaped gate structure for a MOSFET having an SOI structure, the gate-drain capacitance can be reduced and the delay time can be much improved.

A method for fabricating a semiconductor device according to the invention makes possible the following advantages.

(1) Increasing the driving power by preventing the reduction in the effective channel length.

(2) Suppressing the short channel effects by using an L-shaped side wall structure.

(3) Effectively preventing the diffusion of boron (B) from P-type poly-silicon to a bulk, which adversely occurs in a conventional dual-gate technology.

(4) Effectively fabricating a T-shaped gate structure by forming a gate bird's beak by using a dry oxidization process and a wet oxidization process.

(5) Preventing the reduction in the thickness of the LOCOS film when an oxide film is etched by preventing the growth of an oxide film on the surface of the substrate.

(6) Reducing the gate resistance without increasing the capacitance of an oxide film by setting the gate length to be larger than the mask size and setting to be large the thickness of the oxide film corresponding to the gate with a large thickness.

(7) Employing different kinds of implant doses for the high-concentration diffusion layers and for a poly-silicon gate electrode.

(8) Employing a P-type single poly-silicon gate electrode.

According to the fabrication method of the invention, a semiconductor device realizing the above advantages can be easily fabricated in a self-aligning manner by currently used LSI technologies.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising:

a semiconductor substrate of a first conductivity type;

a gate insulating film formed on a selected region on a main surface of the semiconductor substrate;

a gate electrode formed on the gate insulating film; and a source region and a drain region which are formed of high-concentration impurity diffusion layers of a second conductivity type in the semiconductor substrate, wherein a thickness of both end portions of the gate insulating film is larger than a thickness of a center portion of the gate insulating film;

and wherein each of the source region and the drain region includes a first portion located under both end portions of the gate insulating film and a second portion, wherein the first portion has a junction depth that is less than the junction depth of the second portion, and an impurity concentration in the first portion being substantially equal to an impurity concentration in the second portion.

2. A semiconductor device according to claim 1, wherein the impurity concentration in the first portion is in an approximate range of $1 \times 10^{19}$ cm$^{-3}$ to $1 \times 10^{20}$ cm$^{-3}$.

3. A semiconductor device according to claim 1, further comprising L-shaped side walls formed on both sides of the gate electrode, wherein a part of the first portion of the source region and the drain region is disposed under the L-shaped side walls.

4. A semiconductor device according to claim 3, wherein a film thickness of a bottom portion of the L-shaped side walls is larger than a film thickness of a side portion of the L-shaped side walls.

5. A semiconductor device according to claim 1, wherein the gate electrode has a multi-layered structure including an amorphous silicon film and a polycrystalline silicon film.

6. A semiconductor device according to claim 1, wherein the semiconductor substrate is an SOI substrate.

7. A semiconductor device according to claim 1, wherein a junction depth ratio of the first portion to the second portion is within the range of 0.5 to 0.67.

* * * * *